United States Patent
Thollin et al.

(10) Patent No.: US 10,957,639 B2
(45) Date of Patent: Mar. 23, 2021

(54) ELECTRONIC COMPONENT HAVING A TRANSISTOR AND INTERDIGITATED FINGERS TO FORM AT LEAST A PORTION OF A CAPACITIVE COMPONENT WITHIN THE ELECTRONIC COMPONENT

(71) Applicant: COMMISSARIAT A L'ENERGIE ATOMIQUE ET AUX ENERGIES ALTERNATIVES, Paris (FR)

(72) Inventors: Benoit Thollin, Montbonnot Saint Martin (FR); Thibault Catelain, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 34 days.

(21) Appl. No.: 16/488,003

(22) PCT Filed: Feb. 22, 2018

(86) PCT No.: PCT/FR2018/050418
§ 371 (c)(1),
(2) Date: Dec. 2, 2019

(87) PCT Pub. No.: WO2018/154242
PCT Pub. Date: Aug. 30, 2018

(65) Prior Publication Data
US 2020/0135638 A1    Apr. 30, 2020

(30) Foreign Application Priority Data
Feb. 24, 2017 (FR) ...................... 1751499

(51) Int. Cl.
*H01L 23/522* (2006.01)
*H01L 23/00* (2006.01)
(Continued)

(52) U.S. Cl.
CPC .......... *H01L 23/5223* (2013.01); *H01L 24/16* (2013.01); *H01L 27/0629* (2013.01);
(Continued)

(58) Field of Classification Search
CPC . H01L 23/5223; H01L 24/16; H01L 27/0605; H01L 27/0629; H01L 27/0805; H01L 28/40
See application file for complete search history.

(56) References Cited

U.S. PATENT DOCUMENTS 5,744,388 A    4/1998    Chen
5,867,362 A    2/1999    Chen
(Continued)

FOREIGN PATENT DOCUMENTS

CN    103972118 A    8/2014

OTHER PUBLICATIONS

French Preliminary Search Report dated Oct. 8, 2018 in French Patent Application No. PCT/FR2018/050418 (with English translation of Category of Cited Documents), citing documents AA through AG therein, 15 pages.

(Continued)

*Primary Examiner* — Allan R Wilson
(74) *Attorney, Agent, or Firm* — Oblon, McClelland, Maier & Neustadt, L.L.P.

(57) ABSTRACT

An electronic component includes a part incorporating a transistor provided with a control electrode and with first and second electrodes. The electronic component includes first, second, and third electrical connection terminals extending on a connection face of the part incorporating the transistor, the first electrical connection terminal being electrically linked with the first electrode, the second electrical connection terminal being electrically linked with the second electrode and the third electrical connection terminal
(Continued)

being electrically linked with the control electrode. The electronic component includes a first set of electrically conductive fingers and a second set of electrically conductive fingers, the fingers of the first and second sets of fingers being interdigitated, at the level of the connection face, to form at least a part of a capacitive component. The fingers of the first set of fingers are electrically linked to the first electrical connection terminal.

14 Claims, 8 Drawing Sheets

(51) Int. Cl.
  *H01L 27/06* (2006.01)
  *H01L 27/08* (2006.01)
  *H01L 49/02* (2006.01)

(52) U.S. Cl.
  CPC .......... *H01L 27/0805* (2013.01); *H01L 28/40* (2013.01); *H01L 2224/16225* (2013.01); *H01L 2924/156* (2013.01)

(56) References Cited

U.S. PATENT DOCUMENTS

| | | |
|---|---|---|
| 6,410,955 B1 | 6/2002 | Baker et al. |
| 2002/0155677 A1 | 10/2002 | Baker et al. |
| 2002/0190294 A1 | 12/2002 | Lizuka et al. |
| 2003/0089940 A1 | 5/2003 | Baker et al. |
| 2003/0089941 A1 | 5/2003 | Baker et al. |
| 2003/0183864 A1 | 10/2003 | Miyazawa |
| 2005/0219927 A1 | 10/2005 | Baker et al. |
| 2006/0006496 A1 | 1/2006 | Harris et al. |
| 2006/0198179 A1 | 9/2006 | Baker et al. |
| 2007/0082495 A1 | 4/2007 | Mathew et al. |
| 2007/0090986 A1 | 4/2007 | Komatsu et al. |
| 2007/0278551 A1 | 12/2007 | Anthony |
| 2008/0265339 A1* | 10/2008 | Komatsu ............. H01L 27/0805 257/401 |
| 2008/0291601 A1 | 11/2008 | Roozeboom et al. |
| 2008/0291603 A1 | 11/2008 | Matters-Kammerer |
| 2009/0090951 A1 | 4/2009 | Chang et al. |
| 2010/0073993 A1 | 3/2010 | Baker et al. |
| 2011/0080686 A1 | 4/2011 | Farcy et al. |
| 2011/0309420 A1 | 12/2011 | Chang et al. |
| 2012/0086683 A1* | 4/2012 | Segura Puchades .. H01G 4/306 345/205 |
| 2012/0099366 A1 | 4/2012 | Baker et al. |
| 2014/0225222 A1 | 4/2014 | Yu et al. |
| 2015/0084107 A1 | 3/2015 | Li |
| 2015/0155377 A1 | 6/2015 | Kim |
| 2015/0236014 A1 | 8/2015 | Gathman |

OTHER PUBLICATIONS

International Search Report dated Oct. 8, 2018 in International Patent Application No. PCT/FR2018/050418, citing documents AA through AG therein, 14 pages.
Liang, Z., et al., "A Chip-level Process for Power Switching Module Integration and Packaging", IAS, IEEE, 2004, pp. 1932-1939.
Van Wyk, J.D., et al., "A Future Approach to Integration in Power Electronics Systems", IEEE, 2003, pp. 1006-1019.
Shibuya, A. et al., "A Silicon Interposer With an Integrated $SrTiO_3$ Thin Film Decoupling Capacitor and Through-Silicon Vias", IEEE Transactions on Components and Packaging Technologies, vol. 33 No. 3, Sep. 2010, pp. 562-567.
Di Cioccio, L., et al., "From epitaxy to converters topologies what issues for 200 mm GaN/Si?", IEEE, 2015, pp. 16.5.1-16.5.4.
Goualard, O., et al., "Integrated Screen Printed Capacitors in a GaN DC-DC Converter Allowing Double Side Cooling", IEE, Electronics System-Integration Conference, 2014, 5 pages.
Joshin, K., et al., "Outlook for GaN HEMT Technology", Fujitsu Sci. Tech. J., vol. 50 No. 1, pp. 138-143.

* cited by examiner

ELECTRONIC COMPONENT HAVING A TRANSISTOR AND INTERDIGITATED FINGERS TO FORM AT LEAST A PORTION OF A CAPACITIVE COMPONENT WITHIN THE ELECTRONIC COMPONENT

FIELD OF THE INVENTION

The field of the invention relates to electronics, and notably power electronics.

STATE OF THE ART

In the field of power electronics where there is a search for example to form a direct current to alternating current converter, the circuit diagram of FIG. 1 is known. In this circuit diagram there is represented a device 100 comprising an electrical power supply 200 of first and second transistors 300, 400. The electrical power supply 200 is capable of applying a voltage −DC to the source 301 of the first transistor 300. The drain 302 of the first transistor 300 is linked to the source 401 of the second transistor 400 to form an alternating current output 500. Moreover, the electrical power supply 200 is capable of applying a voltage +DC to the drain 402 of the second transistor 400. The gates 303 and 403 respectively of the first and second transistors 300, 400 can then be driven to control the output 500. To supply energy during switching, it is known practice to use decoupling capacitors close to the components incorporating the transistor or transistors. There is therefore a need to bring the decoupling capacitors closer to the transistors.

The document US2015/0155377 describes just such an implementation of a device implementing the circuit diagram of FIG. 1.

Conventionally, an electronic component can be formed separately, then associated with a distinct capacitive component. For example, it is known from the document US20080291603 to couple an integrated circuit to an external capacitor.

The document "A Silicon Interposer With an Integrated SrTiO$_3$ Thin Film Decoupling Capacitor and Through-Silicon Vias" by Akinobu Shibuya et al., published in IEEE Transactions on components and packaging technologies vol. 33, no. 3 in September 2010 pages 582 to 587 describes a means of coupling a capacitor to a transistor. More specifically, this document specifies that the stacking of a capacitor with a chip distinct from the capacitor makes it possible to enhance the electrical performance.

The document US20060006496 describes the formation of capacitors and the interconnection of capacitors for, for example, a transistor.

There is therefore clearly a need to develop novel solutions to, for example, enhance the current integrations of transistor with a capacitive component, and notably further reduce the stray inductances to allow an increase in switching frequencies in the particular case of power electronics.

OBJECT OF THE INVENTION

The aim of the invention is an electronic component proposing bringing at least a part of a capacitive component closer to a transistor to enhance the operation thereof, notably by allowing a better decoupling.

This aim is targeted thanks to an electronic component comprising a part incorporating a transistor provided with a control electrode and with first and second electrodes, the electronic component comprising first, second and third electrical connection terminals extending on a connection face of said part incorporating the transistor, the first electrical connection terminal being electrically linked with the first electrode, the second electrical connection terminal being electrically linked with the second electrode and the third electrical connection terminal being electrically linked with the control electrode. Furthermore, the electronic component comprises a first set of electrically conductive fingers and a second set of electrically conductive fingers, the fingers of the first and second sets of fingers being interdigitated, at the level the connection face, to form at least a part of a capacitive component, and the fingers of the first set of fingers are electrically linked to the first electrical connection terminal.

Particular embodiments of this electronic component can be implemented such that said electronic component can comprise one or more of the following features. These features of the electronic component therefore correspond to particular embodiments.

According to a feature of the electronic component, the fingers of the first set of fingers and of the second set of fingers extend along their length parallel to the connection face.

According to a feature of the electronic component, at least a part of each finger of the first set of fingers forms a continuity of material with at least a part of the first electrical connection terminal.

According to a feature of the electronic component, the first electrical connection terminal comprises an electrically conductive member extending on the connection face, and the fingers of the first set of fingers form, with said member, a continuity of material.

According to a feature of the electronic component, the first electrical connection terminal comprises an electrically conductive member extending on connection face, and a plurality of pillars electrically linked to the member arranged between the pillars and the connection face.

According to a feature of the electronic component, the fingers of the first set of fingers form a continuity of material with the electrically conductive member of the first electrical connection terminal. Alternatively, each finger of the first set of fingers comprises a first longitudinal part and a second longitudinal part, the first part being arranged between the second part and the connection face, said first parts forming, with the member, a first continuity of material, and said second parts each forming, with a corresponding pillar of the first electrical connection terminal, a second continuity of material.

According to a feature of the electronic component, the fingers of the first set of fingers form a continuity of material with the electrically conductive member of the first electrical connection terminal, and the electronic component comprises a third set of electrically conductive fingers and a fourth set of electrically conductive fingers, the fingers of the third set of fingers and of the fourth set of fingers being interdigitated, each finger of the fourth set of fingers forming, with at least one pillar of the first electrical connection terminal, a continuity of material, and:

each finger of the first set of fingers comprises a longitudinal part arranged between a longitudinal part of a finger of the third set of fingers and the connection face,
  each finger of the second set of fingers comprises a longitudinal part arranged between a longitudinal part of a finger of the fourth set of fingers and the connection face,
  the fingers of the first set of fingers are electrically linked to the fingers of the fourth set of fingers, the fingers of the second set of fingers are electrically linked to the fingers of the third set of fingers.

According to a feature of the electronic component, the fingers of the first set of fingers and of the second set of fingers are interdigitated between the connection face and a plane situated at a distance from the connection face and passing through the first, second and third electrical connection terminals.

According to a feature of the electronic component, the first, second and third electrical connection terminals are arranged at the periphery of the connection face resulting in the presence of a volume facing the connection face within which the fingers of the first and second sets of fingers are arranged.

According to a feature of the electronic component, said transistor is a first transistor of which the first electrode is a source electrode of the first transistor, the second electrode is a drain electrode of the first transistor, and the control electrode of the first transistor is a gate electrode of the first transistor, and the electronic component comprises:

an additional transistor forming a second transistor provided with a gate electrode, a source electrode and a drain electrode, a fourth electrical connection terminal extending on the connection face and electrically linked to the gate electrode of the second transistor, a fifth electrical connection terminal extending on the connection face and being electrically linked to the drain electrode of the second transistor, the fingers of the second set of fingers being electrically linked to the fifth electrical connection terminal, the source electrode of the second transistor being electrically linked to the second electrical connection terminal, the first electrical connection terminal being intended to be linked to a direct current negative potential of an electrical power supply, and the fifth electrical connection terminal being intended to be linked to a direct current positive potential of the electrical power supply with the result that the second electrical connection terminal forms an output capable of supply an alternating current.

The invention also relates to a device for converting electrical energy, this device comprising a first electronic component as described and a second electronic component as described, and:

the first electrode of the transistor of the first electronic component is a source electrode, and is intended to be electrically linked to a direct current negative potential of an electrical power supply of the device, the second electrode of the transistor of the first electronic component is a drain electrode, and is intended to be electrically linked to an alternating current output of the device, the control electrode of the transistor of the first electronic component is a gate electrode, the first electrode of the transistor of the second electronic component is a drain electrode, and is intended to be electrically linked to a direct current positive potential of the electrical power supply of the device, the second electrode of the transistor of the second electronic component is a source electrode, and is intended to be linked to the alternating current output, the control electrode of the transistor of the second electronic component is a gate electrode, the fingers of the first set of fingers of the first electronic component are electrically linked to the fingers of the second set of fingers of the second electronic component, the fingers of the second set of fingers of the first electronic component are electrically linked to the fingers of the first set of fingers of the second electronic component.

The invention also relates to a method for fabricating an electronic component, preferably as described, such a method comprises:

a step of supply of a part of the electronic component comprising a transistor provided with a control electrode and first and second electrodes, said part of the electronic component comprising a connection face intended to allow the formation of electrical connection terminals of the electronic component, a step of formation of first, second and third electrical connection terminals of said electronic component at the level of the connection face such that:

the first electrical connection terminal is electrically linked to the first electrode of the transistor, the second electrical connection terminal is electrically linked to the second electrode of the transistor and the third electrical connection terminal is electrically linked to the control electrode of the transistor, the method further comprises a step of formation of a first set of electrically conductive fingers and of a second set of electrically conductive fingers such that:

the fingers of the first set of fingers and of the second set of fingers are interdigitated, at the level of the connection face, to form said at least a part of a capacitive component, and the fingers of the first set of fingers are electrically linked to the first electrical connection terminal.

According to a particular embodiment of the method, the step of formation of the first, second and third electrical connection terminals and the step of formation of the first set of electrically conductive fingers and of the second set of electrically conductive fingers are such that at least a part of the first electrical connection terminal, and at least a part of each of the fingers of the first set of fingers are formed simultaneously.

For example, said at least a part of the first electrical connection terminal and said at least a part of each of the fingers of the first set of fingers are formed simultaneously by a step of formation of an electrically conductive layer on the connection face, than a step of etching of said electrically conductive layer.

The step of etching of the electrically conductive layer can be such that an electrically conductive member is formed for each of the first, second and third connection terminals, and that the fingers of the first set of fingers form, with the member of the first electrical connection terminal, a continuity of material.

The step of formation of the first, second and third electrical connection terminals can comprise a step of production, for each of the first, second and third electrical connection terminals, of an electrically conductive member topped by electrically conductive pillars, and at least a part of each of the fingers of the first and second sets of fingers and the pillars are formed simultaneously by growth according to a growth mask.

BRIEF DESCRIPTION OF THE FIGURES

The invention will be better understood on reading the following description, given purely as a nonlimiting example and given with reference to the drawings in which.

In these figures, the same references are used to denote the same elements.

Moreover, the elements represented in the figures are not necessarily to scale to simplify the understanding of the figures.

DESCRIPTION OF PARTICULAR EMBODIMENTS

The electronic component described hereinbelow differs from the prior art notably in that it proposes forming at least a part of a capacitive component as close as possible to a transistor of the electronic component of which a connection face comprises connection terminals of the electronic component linked to the electrodes of the transistor. For that, it is proposed to incorporate this part of the capacitive component directly with the electronic component. Preferably, the integration of said at least a part of the capacitive component is made during the formation of the connection terminals of the electronic component.

Figure 1:
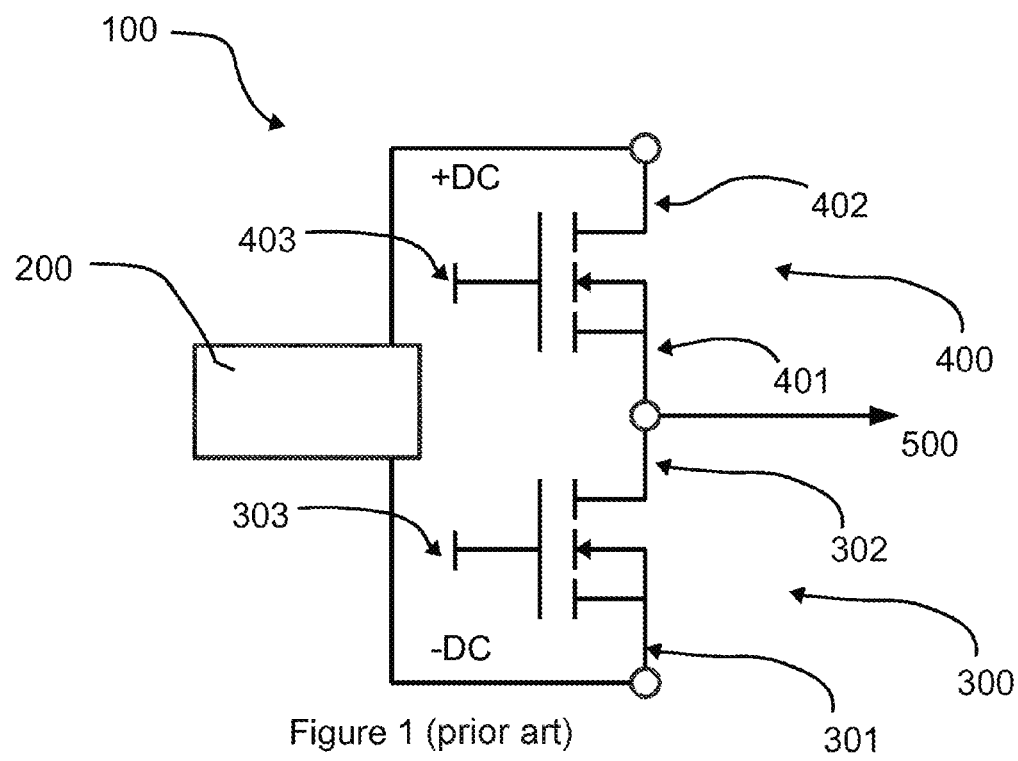
FIG. 1 illustrates a circuit diagram according to the prior art of an electrical energy converter whose function is that of an inverter branch.
Figure 2:
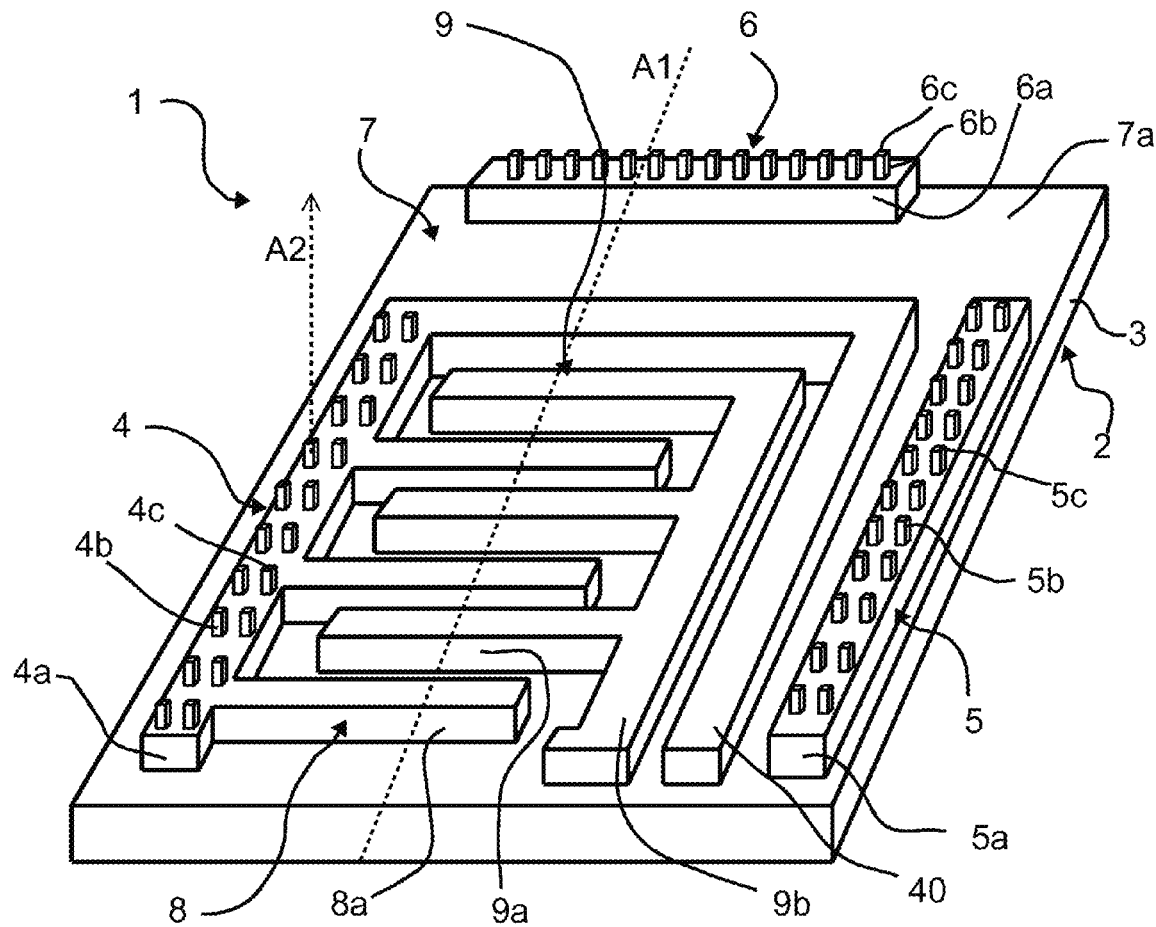
FIG. 2 illustrates in perspective an embodiment of an electronic component according to one mode of execution of the invention.
Figure 3:
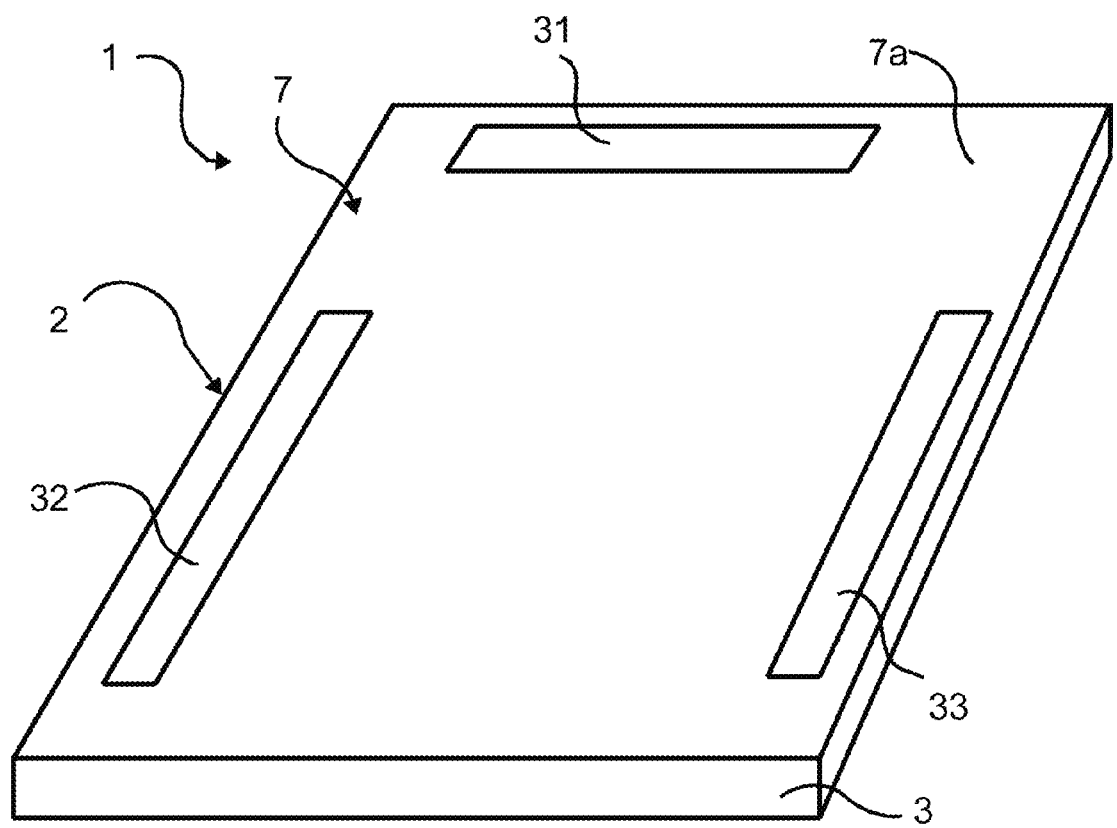
FIG. 3 illustrates a part of the electronic component of FIG. 2.

As illustrated in FIGS. 2 and 3, the electronic component 1 comprises a part 2 incorporating (that is to say comprising) a transistor 3. The transistor 3 is provided with a control electrode 31 and with first and second electrodes 32, 33. The electronic component 1 comprises first, second and third electrical connection terminals 4, 5, 6 (FIG. 2) extending on a connection face 7 of said part 2 incorporating the transistor 3, notably extending from the connection face 7 toward a direction opposite said part 2 incorporating the transistor. Moreover, the first to third electrical connection terminals 4, 5, 6 can also extend longitudinally on the connection face 7. In particular, the connection face 7 can comprise a surface delimited by a layer of electrically insulating material 7a and electrical contact zones. The electrical contact zones are for example each delimited by a corresponding surface of one of the electrodes 31, 32, 33 accessible from an opening formed in the layer of electrical insulating material 7a. The first to third connection terminals 4, 5, 6 are formed at least on the electrical contact zones. The electrically insulating material can be silicon nitride $Si_3N_4$, or silicon oxide $SiO_2$, or tantalum oxide $Ta_2O_5$, or $Al_2O_3$ (aluminum oxide) or AlN (aluminum nitride) or even parylene, and makes it possible to insulate the internal layers of the electronic component. In FIG. 2, the electrical contract zones are not visible because they are in contact with the first to third connection terminals 4, 5, 6 which cover them.

The electronic component is notably a chip incorporating the transistor whose connection terminals are formed at the level of one and the same face, that is to say that they all extend on one and the same face called "connection face".

In particular, it is stated that the first electrical connection terminal 4 is electrically linked with the first electrode 32, that the second electrical connection terminal 5 is electrically linked with the second electrode 33, and that the third electrical connection terminal 6 is electrically linked with the control electrode 31. Notably, the first electrical connection terminal 4 is arranged on the first electrode 32, the second electrical connection terminal 5 is arranged on the second electrode 33, and the third electrical connection terminal 6 is arranged on the control electrode 31.

The electronic component 1 comprises a first set 8 of electrically conductive fingers 8a and a second set 9 of electrically conductive fingers 9a. The fingers 8a, 9a of the first and second sets of fingers are interdigitated, at the level of the connection face 7, to form at least a part of a capacitive component. The capacitive component can be a decoupling capacitive component. The capacitive component is also called capacitor. The interdigitated fingers 8a, 9a of the first and second sets of fingers 8, 9 are arranged to form a part of the capacitor. "At the level of the connection face 7" is understood to mean that the connection face 7 is oriented toward the fingers 8a, 9a, and preferably that the fingers 8a, 9a rest on the connection face, notably on the layer of electrically insulating material 7a, or even on a passivation layer interposed between the fingers 8a, 9a and the connection face 7. "The fingers rest on the connection face" is understood to mean that they are in contact therewith. This notion of the interdigitated fingers at the level of the connection face can also result in the fact that the fingers 8a of the first set of fingers 8 extend, along their length, laterally from the first connection terminal 4. Moreover, the fingers 8a, 9a extend preferentially along their height from the connection face 7. The lateral direction is given here according to a direction orthogonal to a vector normal to the connection face, this normal vector giving the direction of extension of the first electrical connection terminal 4 from the connection face 7 moving away from said connection face 7. The fingers 8a, 9a of the first and second sets of fingers 8, 9 extend notably on the layer of electrical insulating material 7a.

Moreover, the fingers 8a of the first set 8 of fingers are electrically linked to the first electrical connection terminal 4. It is then understood that the first electrical connection terminal 4 preferentially forms a connection bus for the fingers 8a of the first set 8 of fingers, which makes it possible to bring them closer to the transistor compared with the prior art by incorporating them with an electrical connection terminal.

"The fingers of the first set 8 and of the second set 9 of fingers being interdigitated" is understood to mean that a succession of fingers is formed along an axis A1 orthogonal to the directions of longitudinal extension of the fingers. This succession of fingers comprises, notably alternately, a finger of a first set of fingers, then a finger of the second set of fingers, etc. In particular, the fingers 8a of the first set 8 of fingers are all electrically connected to one another by the first connection terminal 4 and the fingers 9a of the second set 9 of fingers are all electrically connected to one another, notably via a connection bus 9b for the fingers 9a of the second set 9 of fingers. Obviously, each finger 8a of the first set 8 of fingers is away from each of the fingers 9a of the second set 9 of fingers.

The height of the fingers 8a of the first set 8 of fingers is generally equal to the height of the fingers 9a of the second set of fingers, the height being given along an axis orthogonal to the connection face 7. The material or materials of the fingers of the first set of fingers and of the second set of fingers are preferentially the same.

The fingers 8a, 9a of the first set 8 of fingers and of the second set 9 of fingers extend preferentially along their length parallel to the connection face 7, and preferentially so as to be in contact with the connection face 7. The layer of electrically insulating material 7a makes it possible to limit the leaks, and notably the short-circuits at the level of the connection face 7 between the electrical connection terminals 4, 5, 6, and makes it possible to participate in increasing the capacitance value by virtue of its relative permativity. Thanks to the electronic component as described, it is possible to produce a decoupling as close as possible to the transistor with a reduced stray inductance compared to the known techniques which propose coupling the electronic component with a capacitive component distinct from the electronic component.

Figure 9:
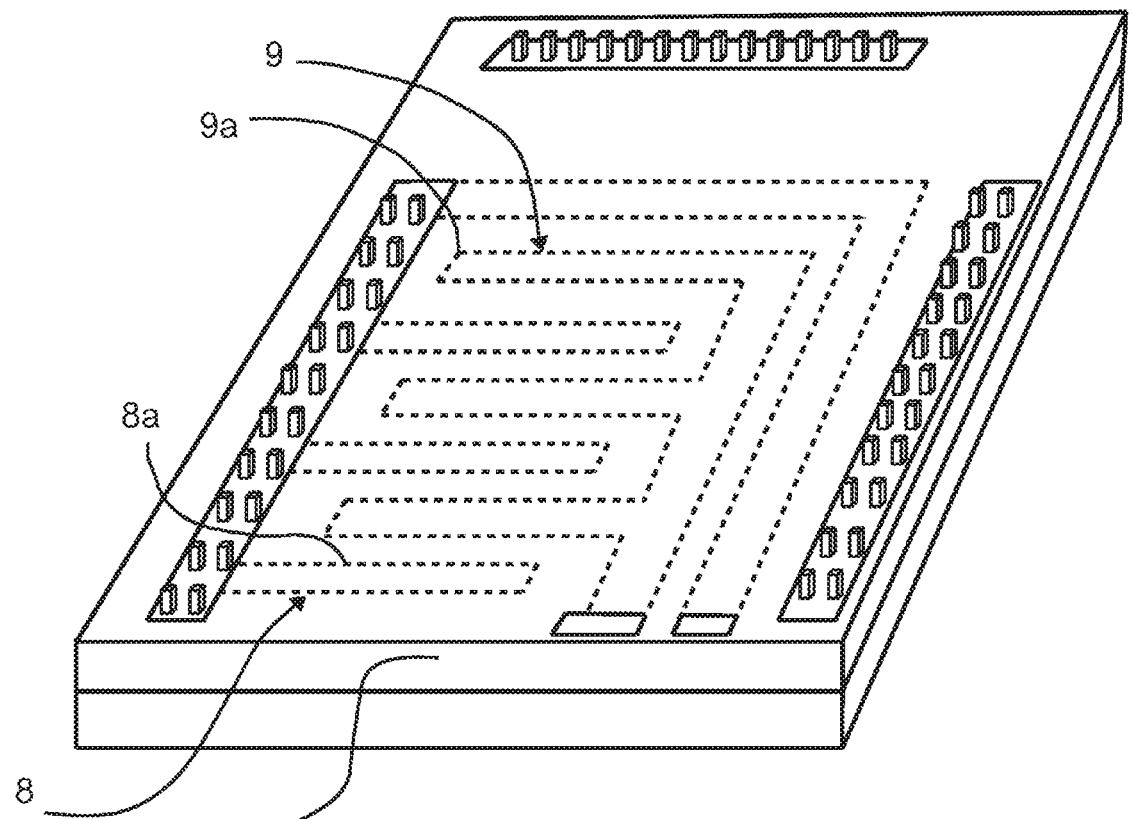
FIG. 9 represents FIG. 2 to which has been added a layer of dielectric material.

Preferably, a passivation material also called dielectric material, that can comprise, or be formed by, $SiO_2$, or $Si_3N_4$, or $Al_2O_3$, or $Ta_2O_5$, or AlN, or parylene is used to fill the spaces between the interdigitated fingers, even cover them. The passivation material offers the benefit of increasing the value of the capacitance. Indeed, the more electrically insulating the passivation material is, the more possible it is to bring the fingers close together and therefore increase the value of the capacitance. Without interpositioning of the passivation material, the insulation can be done by air, but that degrades the capacitance and increases the risks of short circuit. In this sense, the interdigitated fingers 8a, 9a will preferentially always be separated, and notably covered, by the passivation material. This point is illustrated notably in FIG. 9 in which the fingers 8a, 9a of the first and second sets of fingers 8, 9, covered by a passivation layer 13 of abovementioned passivation material, are represented by dotted lines.

In the present description, when speaking of electrical connection terminals 4, 5, 6 of the electronic component, these are connection terminals, or connection pins, which allow the electronic component 1 to be connected to third-party elements external to said electronic component 1. The connection terminals 4, 5, 6 are therefore, for example, external connection terminals of the electronic component intended to link it to at least one distinct electronic component, for example by chip placement, or "flip-chip" in the art, or, for example, intended to accommodate hardwiring to make the electrical connection. At least a part of the connection terminals 4, 5, 6 can therefore protrude from an outer face of the electronic component.

Moreover, it is proposed here to use a volume, or region, usually left "dead", that is to say not functionalized, to incorporate therein the interdigitated fingers 8a, 9b. In other words, preferably, the fingers 8a, 9b of the first set 8 of fingers and of the second set 9 of fingers are interdigitated between the connection face 7 and a plane situated at a distance from the connection face 7, said plane being notably parallel to the connection face 7, and passing through the first, second and third electrical connection terminals 4, 5, 6. Notably, the plane situated at a distance from the connection face 7 passes through ends of the first, second and third electrical connection terminals 4, 5, 6 that are distal from the connection face 7. These ends are said to be situated vertically above the connection face 7 when this connection face 7 is considered as defining the horizontal. It is then understood that the fingers 8a, 9a of the first and second sets of fingers 8, 9 are arranged at the surface of the part 2 of the electronic component 1.

Preferably, the first, second and third electrical connection terminals 4, 5, 6 are arranged at the periphery of the connection face 7, resulting in the presence of a volume facing the connection face 7 within which are arranged the fingers 8a, 9a of the first and second sets 8, 9 of fingers. Thus, it is understood that, with this particular arrangement of the electrical connection terminals 4, 5, 6, there is the benefit of a central space of the connection face 7 for the interdigitated fingers to be arranged therein.

Figure 4:
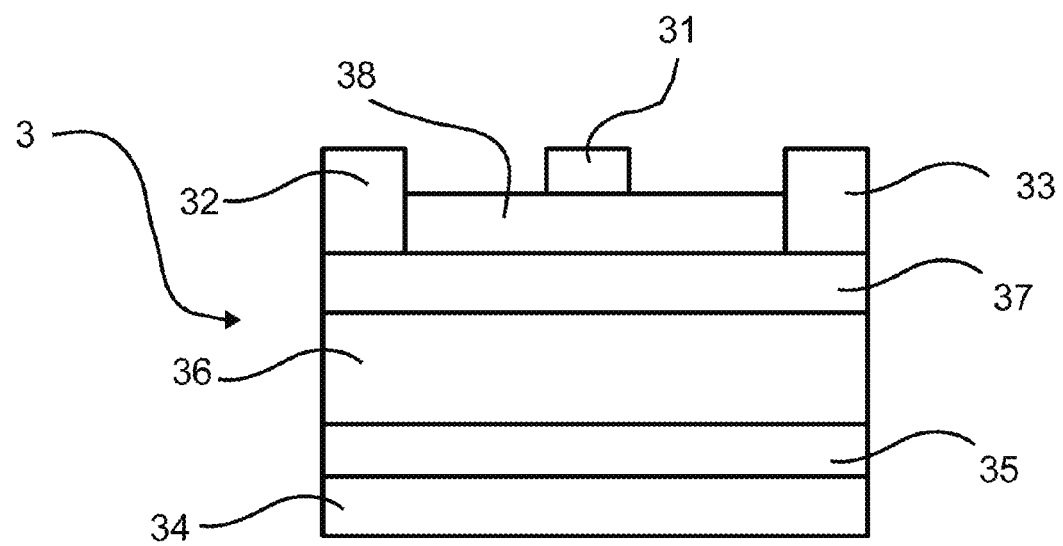
FIG. 4 illustrates a transistor according to the prior art.

In particular, the transistor, and notably each transistor targeted in the present description is a transistor of GaN (gallium nitride) type with high electron mobility, more particularly known by the abbreviation HEMT for "High Electron Mobility Transistor". For such a transistor, the source, drain and gate contacts are arranged at the level of one and the same face of the chip housing the transistor. FIG. 4 illustrates, schematically and in a known manner, a transistor 3 provided with gate 31, source 32 and drain 33 electrodes. The transistor 3 is formed by a stacking comprising, in succession, a substrate 34, for example of silicon (Si), buffer layers 35 making it possible to compensate for the parametric mismatch of the materials (Si and GaN) and the thermal expansion coefficient differences, a layer of i-GaN 36 (for intrinsic GaN), a layer of AlGaN 37 (for aluminum-gallium nitride), a layer of n-GaN 38 (n-doped GaN). The gate electrode 31 is formed on the layer of n-GaN, the source electrode 32 and the drain electrode 33 are formed on either side of the layer of n-GaN 38 and are in contact with the layer of AlGaN 37. The interface between the layers of AlGaN and i-GaN allow the creation of a 2-dimensional electron gas 2DEG. Such a transistor structure is notably described in detail in the document "Outlook for GaN HEMT Technology" by Kazukiyo Joshin et al published in "Fujitsu Sci. Tech. J., Vol, 50, No, 1, pp 138-143" in January 2014. Other structures can obviously be used.

The GaN transistors have the particular feature of being planar, and of offering their electrical connections on one and the same face, called front face, of a chip.

In FIG. 2, a branch 40 formed in continuity with the first connection terminal 4 extends partly along the connection bus 9b for the fingers of the second set of fingers, notably on the layer of electrically insulating material 7a, its role is to bring an electrical contact zone to the edge of the electronic component in order to link it to another electronic component.

According to a preferred embodiment illustrated in FIG. 2, each finger 8a, or at least a part of each finger 8a, of the first set of fingers 8 forms a continuity of material with at least a part of the first electrical connection terminal 4. Preferably, the fingers 8a of the first set of fingers 8 extend, along their length, laterally from the first electrical connection terminal 4 relative to the direction A2 (FIG. 2) orthogonal to the connection face 7. Thus, it is understood here that the integration of said at least a part of the capacitive component is advanced by situating it as close as possible to the transistor, and preferably to the first electrical connection terminal 4 which can be used to power the electronic component 1, notably when the latter is used in the context of an electrical energy conversion electronic component, or in a more global device allowing this function as will be seen hereinbelow.

"Continuity of material" is understood to mean a coherent one-piece assembly, fabricated notably simultaneously. When things, for example two things, form a continuity of material, it is understood that they are formed in the same material and that there is no break between these things, the material can for example be a pure material or an alloy comprising different compounds. These things have notably been obtained simultaneously by deposition or growth of the associated material. In other words, said at least a part of the first electrical connection terminal 4 and said at least a part of each finger 8 of the set 8 of fingers form part of a single block: they therefore belong to a monolithic element.

As illustrated in FIG. 2, the first electrical connection terminal 4 can comprise an electrically conductive member 4a extending on the connection face 7, and preferably in contact with the first electrode 32. The first electrical connection terminal 4 possibly also comprises a plurality of pillars 4b, preferably of copper. The pillars 4b are electrically conductive. The pillars 4b are electrically linked to the electrically conductive member 4a which can then form a support for these pillars 4b. The electrically conductive member 4a is arranged between the pillars 4b and the connection face 7. In particular, it can also be said that the pillars top a corresponding electrically conductive member. Notably, the pillars 4b extend along their length or height in a direction opposite to the connection face 7 and notably along an axis orthogonal to the connection face 7. The pillars 4b are not necessary, but can be useful to facilitate the subsequent connection or mounting of the electronic component in three-dimensional structures. A pillar can therefore be a connection bump, or post. In the case where the pillars are present, they can each be in direct contact with the corresponding electrically conductive member or with a base (not represented) coming from a layer having been used for example for the growth of the corresponding pillar as will be seen in the context of the description of the method hereinbelow. In the case where the pillars 4b are not present, the first connection terminal 4 comprises only the member 4a. Notably, the member 4a is said to rest on the connection face 7, preferably on an electrical contact zone of the connection face 7: the member 4a is then in contact with the first electrode 32. In particular, the fingers 8a of the first set 8 of fingers form, with the electrically conductive member 4a of the first connection terminal 4, a continuity of material.

Figure 5:
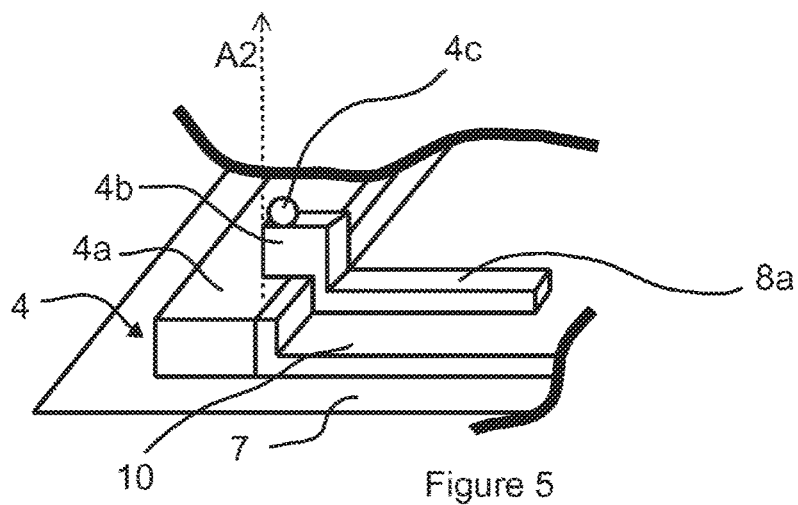
FIG. 5 illustrates a particular embodiment of the electronic component seen in perspective.

According to an alternative to FIG. 2 illustrated schematically in FIG. 5, each finger 8a of the first set of fingers forms a continuity of material with at least one pillar 4b of the first connection terminal 4. It is therefore understood that there are two levels in which the fingers can be incorporated: the member 4a level and the pillar 4b level. FIG. 5 schematically illustrates the principle in which a continuity of material comprises the pillar 4b, and extends laterally to the direction A2 to also form a finger 8a of the first set 8 of fingers. Notably, in this FIG. 5, a passivation layer 10 is interposed between the connection face 7 and the finger 8a. The material of the passivation layer 10 can comprise, or be, $SiO_2$, $Si_3N_4$, $Al_2O_3$, $Ta_2O_5$, AlN or parylene. The embodiment of FIG. 5 can be difficult to implement and that of FIG. 2 or 6 and 7 will be preferred.

Figure 6:
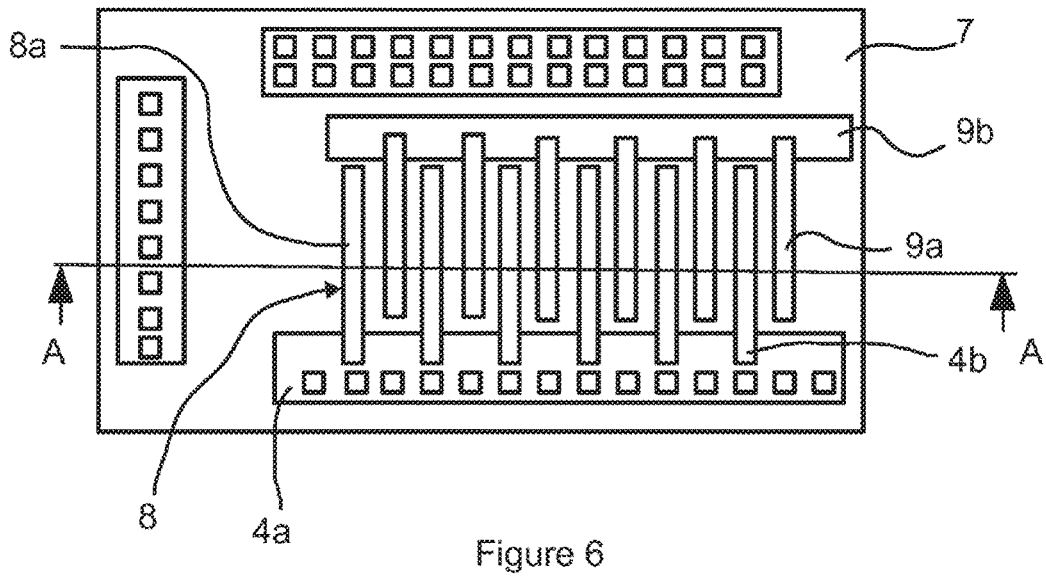
FIGS. 6 and 7 illustrate another particular embodiment of the electronic component, FIG. 7 being a view in cross section along A-A of FIG. 6 which is a top view of the electronic component.
Figure 7:
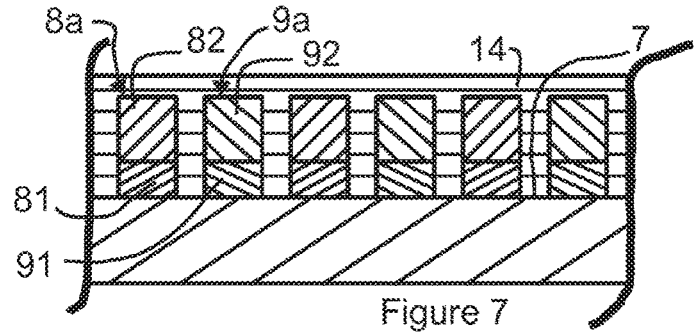

For the embodiment of FIGS. 6 and 7 the fingers 8a form a continuity of material with the member 4a and a continuity of material with at least one pillar 4b. Here, each finger 8a of the first set 8 of fingers comprises a first longitudinal part 81 and a second longitudinal part 82. The first longitudinal part 81 of the corresponding finger of the first set of fingers being arranged between the second longitudinal part 82 of said finger and the connection face 7. The first longitudinal parts of the fingers of the first set of fingers form, with the electrical connection member 4a of the first terminal 4, a first continuity of material, and the second longitudinal parts 82 of the fingers of the first set of fingers each forming, with a corresponding pillar 4b of the first electrical connection terminal 4, a second continuity of material. Here, each first longitudinal part of finger can be in direct contact with a second longitudinal part of finger or with the interposition of a material coming from a layer having allowed the growth of the second longitudinal part. In this case, the fingers 9a of the second set of fingers 9 (FIG. 6) also each comprise (FIG. 7) a first longitudinal part 91 situated at the same level as the first longitudinal parts 81 of the fingers 8a of the first set of fingers and forming notably a continuity of material with the connection bus for the fingers 9a of the second set of fingers mentioned hereinabove. These fingers 9a of the second set of fingers 9 also each comprise a second longitudinal part 92 arranged above the first longitudinal part 91 of the fingers 9a (in other words, the first part 91 is then arranged between the second part 92 and the connection face 7), the second longitudinal parts being obtained in a way similar to the pillars. In FIG. 7, the reference 14 represents a passivation material covering the fingers not represented in FIG. 6 for reasons of clarity, this material can be like that described previously. This embodiment makes it possible to increase the facing surfaces of two adjacent fingers.

In the context of the electronic component, the electrically conductive member 4a has a height from the connection face 7 which can be between 1 μm and 5 μm, and more particularly be equal to 4 μm. The electrically conductive member 4a can have a width of between 300 μm and 1 mm and the length of the member 4a can be adapted to the space available for it to be formed. Notably, the length and the width of an electrically conductive member are measured along axes orthogonal to one another and orthogonal to an axis measurement of the height of said member which is orthogonal to the connection face. Where appropriate, the pillars can each have a height (or length) which can be between 5 μm and 30 μm, and notably measured along an axis orthogonal to the connection face, and notably equal to 10 μm. The pillars can each have a width, or lateral dimension (measured orthogonally to its height), which is equal to the height of said pillar. Obviously, the dimensions of the pillars can be variable as a function of the fabrication method. The height of the fingers 8a, 9a along an axis parallel to the direction of extension A2 of the first connection terminal 4 from the connection face 7 can be equal, or substantially equal, where appropriate, to the height of the member 4a in case of continuity of material of the fingers of the first set 8 of fingers with the member 4a, or where appropriate to the height of the pillars 4b in case of continuity of material of the fingers of the first set of fingers with one or more pillars, or where appropriate to the sum of at least the height of the member 4a and of a corresponding pillar. The height of a finger is therefore notably measured along an axis orthogonal to the connection face. The length of the fingers can be dependent on the space available for them to be formed. The adjacent interdigitated fingers can be separated by a distance comprised between 1 µm and 100 µm and the fingers can have a width comprised between 1 µm and 30 µm, this being dependent notably on the fabrication techniques used. The width of a finger is notably measured orthogonally to its length and to its height. The number of interdigitated fingers can be a function of the structure of the electronic component, preferably a maximization of this number will be sought according to the space available for them to be formed.

Moreover, a brazing bump 4c (FIGS. 2 and 5), for example made of SnAg (tin-silver) or SnAgCu (tin-silver-copper) or AuSn (gold-tin) or AuSi (gold-silicon) or AuGe (gold-germanium) alloy, can be formed in the extension of each pillar 4b of the first connection terminal. To facilitate the representation in FIG. 2, the brazing bump corresponds to the end of a corresponding pillar. The role of this brazing bump is to make it possible to facilitate the connection of the electronic component by brazing to a third-party component. It is also possible to replace the brazing bump with a sintering paste.

Preferably, the second and third electrical connection terminals 5, 6 are similar to the first electrical connection terminal 4. Thus, as illustrated in FIG. 2, the second electrical connection terminal 5 can comprise an electrically conductive member 5a extending on the connection face 7 and a plurality of pillars 5b, preferably of copper, which top the member 5a of the second electrical connection terminal 5 while extending along their length along an axis orthogonal to the connection face 7. Similarly, the third electrical connection terminal 6 can comprise an electrically conductive member 6a extending from the connection face 7 and a plurality of pillars 6b, preferably of copper, which top the member 6a of the third electrical connection terminal 6 while extending along their length along an axis orthogonal to the connection face 7. Moreover, a brazing bump 5c, 6c, for example as described previously, can be formed at the top of each pillar 5b, 6b. Notably, the first, second and third electrical connection terminals 4, 5, 6 have been formed by common microelectronic technological steps as will be described in more detail hereinbelow.

In the present description, the pillars are notably pillars made of copper of which the end opposite the corresponding electrically conductive member is preferentially covered by the brazing bump. The pillars of copper are also known in the art by the term "copper pillar". A continuity of material formed by a finger, or a part of finger, and a pillar, will therefore preferentially be made of copper.

In the present description, the electrically conductive member of one, notably of each, connection terminal can comprise, or be formed by: an alloy of AlSi (that is to say aluminum-silicon, for example composed of 99 at. % of aluminum and of 1 at. % of silicon, with at. % representing the atomic percentage, hereinafter in the description AlSi represents the AlSi alloy), or copper with a gold finish to avoid the oxidation of the copper, or even aluminum. In other words, where appropriate, AlSi, or copper, or aluminum is involved in the composition of the material forming the electrically conductive member: a continuity of material comprising an electrically conductive member and fingers or parts of fingers can then be formed by this material.

Figure 8:
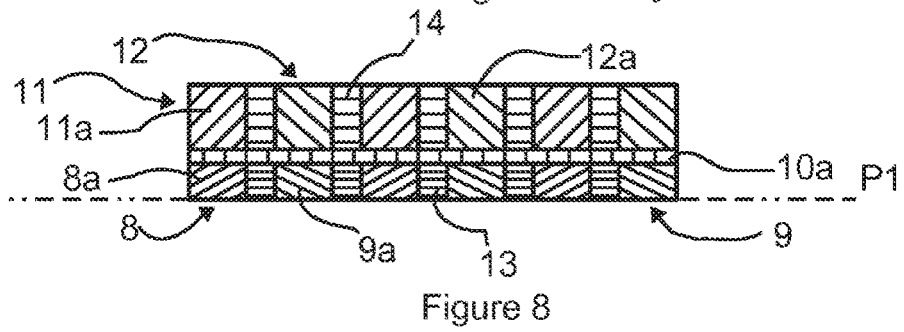
FIG. 8 illustrates, by a schematic cross-sectional view, another particular embodiment with two stages of interdigitated fingers.

According to a particular implementation illustrated in FIG. 8 representing a cross-section of a portion of the electronic component showing said at least a part of the capacitive component, the fingers 8a of the first set 8 of fingers form a continuity of material with the electrically conductive member of the first electrical connection terminal for example in the manner of what is illustrated in FIG. 2. FIG. 8 is a cross-sectional view at right angles to the directions of extensions of the fingers making it possible to see how the fingers are interdigitated according to this particular implementation. Here, the electronic component comprises a third set 11 of electrically conductive fingers 11a and a fourth set 12 of the electrically conductive fingers 12a. The fingers 8a of the first set of fingers 8 are electrically linked to the fingers 12a of the fourth set of fingers 12, for example by the member of the first connection terminal, and the fingers 9a of the second set 9 of fingers are electrically linked to the fingers 11a of the third set 11 of fingers for example by the connection bus for the fingers 9a of the second set of fingers. The fingers 11a, 12a of the third set 11 of fingers and of the fourth set 12 of fingers are interdigitated above the fingers 8a, 9a of the first and second sets 8, 9 of fingers to form a corresponding part of the capacitive component. In other words, the fingers 8a, 9a of the first and second sets 8, 9 of fingers are interdigitated between the connection face and the fingers 11a, 12a of the third and fourth sets 11, 12 of fingers. Each finger 12a of the fourth set 12 of fingers can form, with at least one pillar 4b of the first electrical connection terminal 4, a continuity of material, for example in a manner of what is illustrated in FIG. 5. By combining the teachings of FIGS. 2 and 5, it is possible to make two distinct fingers superposed and each kept at a distance from one another. Each finger 8a of the first set 8 of fingers comprises a longitudinal part arranged, or interposed, between a longitudinal part of a finger 11a of the third set 11 of fingers and the connection face represented schematically here by the plane P1 at right angles to the plane of FIG. 8. Moreover, each finger 9a of the second set 9 of fingers comprises a longitudinal part arranged, or interposed, between a longitudinal part of a finger 12a of the fourth set 12 of fingers and the connection face. It is then understood that it is, here, possible to form several types of capacitances within one and the same electronic component at the level of its connection face. Each of the fingers 11a of the third set of fingers is at a distance from each of the fingers 12a of the fourth set of fingers. The fingers 11a, 12a of the second and third sets of fingers are at a distance from the fingers 8a, 9a of the first and second sets of fingers. Notably, the fingers 8a and 12a of the first and fourth sets of fingers are electrically linked to the first electrical connection terminal, and the fingers 9a and 11a of the second and third sets of fingers are electrically linked to one another and are intended to be linked to another connection terminal, notably of another transistor. Ultimately, three types of capacitances are therefore obtained: one lateral at a first level relative to the connection face between the interdigitated fingers 8a, 9b of the first and second sets of fingers; another lateral at a second level relative to the connection face between the interdigitated fingers 11a, 12a of the third and fourth sets of fingers; and one vertical between these first and second levels. Here, a passivation layer 10a is interposed between the level of the fingers of the first and second sets of fingers and the level of the fingers of the third and fourth sets of fingers, this passivation layer can comprise, or be formed by, $SiO_2$, or $Si_3N_4$, or $Ta_2O_5$, or AlN, or $Al_2O_3$, or parylene. In particular, here, the fingers of the first, second, third and fourth sets of fingers are parallel to one another, and the fingers of the first and second sets 8, 9 of fingers extend at the level of one and the same plane which is parallel to the plane of extension of the fingers 11a, 12a of the third set of fingers and of the fourth set of fingers.

In particular, in FIG. 8 the adjacent fingers 8a, 9a of the first and second sets 8, 9 of fingers are separated by a dielectric material 13 also called passivation material as described previously (FIGS. 8 and 9) which can even cover the fingers 8a, 9a and thus be common to the layer 10a described previously. Moreover, the same applies where appropriate for the fingers 11a, 12a of the third and fourth sets of fingers 11, 12 (FIG. 8) which are separated by a dielectric material 14 also called passivation material as described previously which can be deposited after the formation of the fingers 11a, 12a (FIG. 8).

The choice of the dielectric material (or passivation material) between the fingers serves to enhance the capacitance formed between two adjacent fingers of two different sets of fingers. In this sense, it is said that the fingers 8a of the first set 8 of fingers and the fingers 9a of the second set 9 of fingers are interdigitated such that, for any pair of adjacent fingers, said fingers of the pair are separated by a dielectric material. The chosen dielectric material has a role in enhancing the value of the capacitance as is described hereinbelow.

The value of a capacitance C between two adjacent fingers is expressed as a function of the relative permittivity of the material $\varepsilon_r$ used as dielectric material between two adjacent interdigitated fingers, the vacuum electrical permittivity $\varepsilon_0$, the facing surface S of the two interdigitated adjacent fingers and the inter-finger distance e according to the relationship (eq. 1).

$$C = \frac{\varepsilon_0 \times \varepsilon_r \times S}{e} \quad \text{(eq. 1)}$$

From this equation (eq. 1) it is possible to conclude that to optimize the value of the capacitance, it is possible to increase the facing surface, and/or to increase the relative permittivity of the dielectric material $\varepsilon_r$, and/or to reduce the distance e. The achievable distance e depends firstly on the voltage withstand strength of the dielectric material. For an electronic component intended to withstand 650 V, a voltage withstand strength of around 1000 V is desirable, the preferred insulation that can be used is $Si_3N_4$ or $SiO_2$. The dry deposited $Si_3N_4$ or the $SiO_2$ are preferred because they can have a dielectric strength of the order of 1000 kV/mm. With these materials, it is possible to reduce the distance e to 1 µm to withstand the required voltage. As is known, the permittivity depends on the material chosen, on the surface S, on the resolution of the fingers (thickness and width dependent on "aspect ratio" thickness divided by width). For a standard method, the aspect ratio is around 2, which makes it possible to have a finger width and an inter-finger distance two times smaller than the deposited thickness. In the case of the present invention, the value of the facing surface between two adjacent fingers can depend on the height of the deposition and on the resins/masks used to form the fingers of the electronic component which influence the resolution and the achievable aspect ratio (width of the fingers of comb and space between two fingers (e)). For the available surface facing the connection face 7, assuming that only the value of the lateral capacitance, that is to say the capacitance between facing faces of two adjacent fingers, and not the planar capacitance value is taken into account, that makes it possible to achieve capacitance values of 600 pF. To achieve this capacitance of 600 pF, the fingers 8a each form a continuity of material with at least one corresponding pillar and have the following dimensions: 10 µm height, 5 µm wide and with 5 µm separation between fingers, and a dielectric of permittivity of around 7 is used (such as $Si_3N_4$ which, when it is deposited dry, for example by PECVD, the abbreviation for plasma-enhanced chemical vapor deposition, makes it possible to even lower the distance between fingers to 1 µm). In the case where the fingers are 2 µm thick, 1 µm wide and are separated pairwise by 1 µm, the equivalent capacitance value with $Si_3N_4$ can reach 3000 pF, this case is notably possible when the fingers 8a of the first set of fingers form a continuity of material with a member 4a. In this paragraph, a height is given along an axis orthogonal to the connection face. In this paragraph, a width is given along an axis orthogonal to the axes of elongation of the fingers and to the axis orthogonal to the connection face. In this paragraph, a separation dimension is given along an axis orthogonal to the axes of elongation of the fingers and to the axis orthogonal to the connection face. The material $Ta_2O_5$, notably deposited dry, has a permittivity four times greater than $Si_3N_4$ and can be used when the fingers of the first set form, with the member of the first connection terminal, a continuity of material by lateral extension of the member because it is difficult to deposit for layers ranging beyond 1 µm. In this sense, the use of $Ta_2O_5$ will be preferred when the fingers are separated by a distance of between 1 µm and 2 µm.

In other words, it is clear that the person skilled in the art is able to adapt the fabrication method which will be described hereinbelow to form the electronic component to obtain the desired capacitance of the capacitive component.

According to one example, when the fingers 8a form a continuity of material with the member 4a, the fingers 8a and 9a have a height (or thickness) relative to the connection face 7 of 2 µm, a width of 1 µm, and two adjacent interdigitated fingers of said part of the capacitive component are preferentially separated by a distance of 1 µm. The dimensions are given here by way of example, the person skilled in the art will be able to adapt them according to the desired capacitive component.

According to one example, when the fingers 8a each form a continuity of material with a pillar 4b, the fingers 8a and 9a have a height relative to the connection face 7 of 10 µm, a width of 5 µm, and two adjacent fingers of said part of the capacitive component are separated by a distance of 5 µm. The dimensions are given here by way of example, the person skilled in the art will be able to adapt them according to the desired capacitive component.

Generally, when the spaces between the fingers 8a, 9a of the first and second sets of fingers are filled by the dielectric material, the latter exhibits a dielectric strength and a permittivity adapted to the dimensions of the fingers, this material can be notably, but in a nonlimiting manner, $SiO_2$ or $Ta_2O_5$. The person skilled in the art will be able to choose the dielectric material according to the structure to be covered.

Generally, the length of the fingers will be dependent on the space available at the level of the connection face 7, for example, on some electronic components, it may be possible to exploit an unoccupied zone of 25 $mm^2$, this obviously depending on the architecture of the electronic component.

More particularly, depending on the applications targeted, the dielectric material chosen to fill the spaces between the interdigitated fingers must have the highest possible permittivity, and its dielectric characteristics must for example make it possible to withstand 1000 V (this depending on the voltage rating of the component) for the distance separating two interdigitated adjacent fingers.

Generally, when the fingers of the first set of fingers form, with the member of the first connection terminal, a continuity of material, the facing surfaces between fingers are smaller than in the case where the fingers of the first set of fingers each form a continuity of material with one of the pillars 4*b*, but it is possible to have a better resolution and therefore to increase the number of fingers to increase the value of the capacitance. When each finger of the first set of fingers forms, with a corresponding pillar, a continuity of material, the facing surfaces of two adjacent fingers are increased to the detriment of the number thereof. Everything will therefore be a process of compromise as a function of what is sought to be obtained as capacitance value for the capacitive component. From a practical viewpoint, the embodiment in which the continuity of material comprises the fingers 8*a* and the member 4*a* is preferred, because this makes it possible to more easily form connection pillars 4*b* which will not be hampered by the fingers for, for example, producing the "flip-chip" connection.

Figure 10:
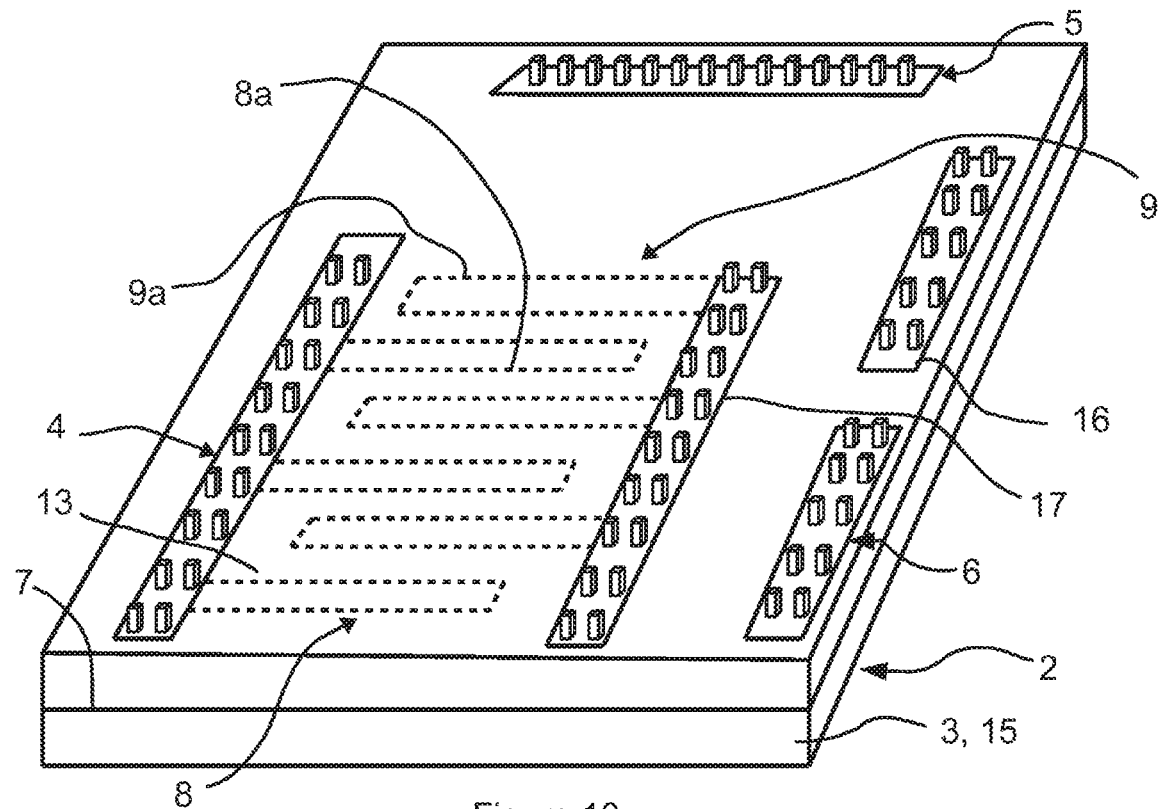
FIG. 10 illustrates an embodiment of an electronic component seen in perspective intended to particulate in the formation of an electrical energy converter.
Figure 11:
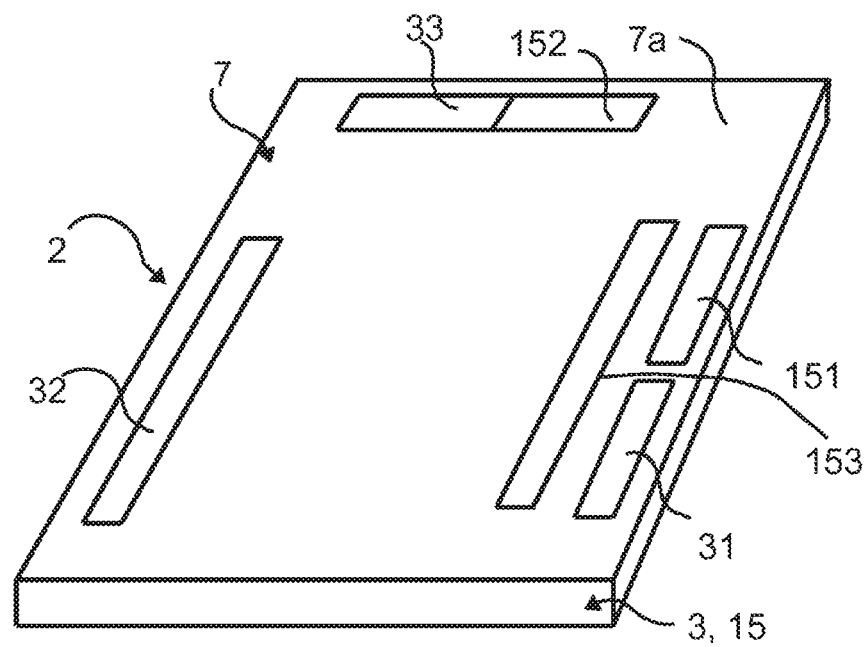
FIG. 11 illustrates, seen in perspective, the part of the electronic component of FIG. 10 on which the connection terminals and the interdigitated fingers will be formed.

According to an implementation illustrated in FIGS. 10 and 11, said transistor 3 is a first transistor 3 of which the first electrode 32 (linked to the first terminal 4) is a source electrode of the first transistor 3, the second electrode 33 (linked to the second terminal 5) is a drain electrode of the first transistor 3, and the control electrode 31 (linked to the third terminal 6) is a gate electrode of the first transistor 3. Moreover, the electronic component comprises an additional transistor 15 (housed like the transistor 3 in the corresponding part 2 of the electronic component 1) forming a second transistor 15 provided with a gate electrode 151, a source electrode 152 and a drain electrode 153. A fourth electrical connection terminal 16 extends on the connection face 7, and is electrically linked to the gate electrode 151 of the second transistor 15. A fifth electrical connection terminal 17 extends on the connection face 7, and is electrically linked to the drain electrode 153 of the second transistor 15. Here, the fingers 9*a* of the second set 9 of fingers are electrically linked to the fifth electrical connection terminal 17, and preferably each form a continuity of material with at least a corresponding part of the fifth electrical connection terminal 17. Preferably, at least a part of the first and fifth connection terminals and the fingers 8*a*, 9*a* of the sets 8 and 9 of fingers have been obtained simultaneously by deposition or growth of one and the same material. The source electrode 152 of the second transistor 15 is electrically linked to the second electrical connection terminal 5. According to this implementation, the first electrical connection terminal 4 is intended to be linked to a direct current negative potential of an electrical power supply and the fifth electrical connection terminal 17 is intended to be linked to a direct current positive potential of the electrical power supply with the result that the second electrical connection terminal 5 forms an output capable of supplying an alternating current when the gates of the first and second transistors 3, 15 are driven appropriately. Here, the first transistor is also called "low side" transistor in the art and the second transistor is also called "high side" transistor in the art. In other words, according to this implementation, the electronic component can be used to form an electrical energy converter, notably capable of supplying an alternating energy when the power supply is direct. Here, the integration is optimized since, from one and the same electronic component, an electronic component is formed which is capable of current conversion. The capacitive component is formed here by the fingers 8*a*, 9*a* of the first and second sets of fingers represented by dotted lines which are preferentially separated and covered by a dielectric material 13 (or passivation material), notably of the type as described previously to produce the passivation of the fingers. In particular, here, the electronic component can be mounted on a control component comprising a control system of the gates of the first and second transistors and a direct current source linked to the source electrode of the first transistor and to the drain electrode of the second transistor. This embodiment is preferred because it offers a very good integration and makes it possible to form a bridge branch, or inverter branch, with a part of its decoupling capacitance, a capacitor external to the electronic component can be added to complete the desired capacitance value.

Preferably, the electronic component or the electronic components can be used to form an electrical energy converter allowing for current-voltage switching such that, when a transistor is open, it no longer allows the current to pass but holds the voltage. Typically, the electrical energy converter admits as input a direct voltage which can reach several kV and, to supply energy during switching, the capacitive component, also called decoupling capacitance (or capacitor), must be placed as close as possible to the transistors.

Figure 12:
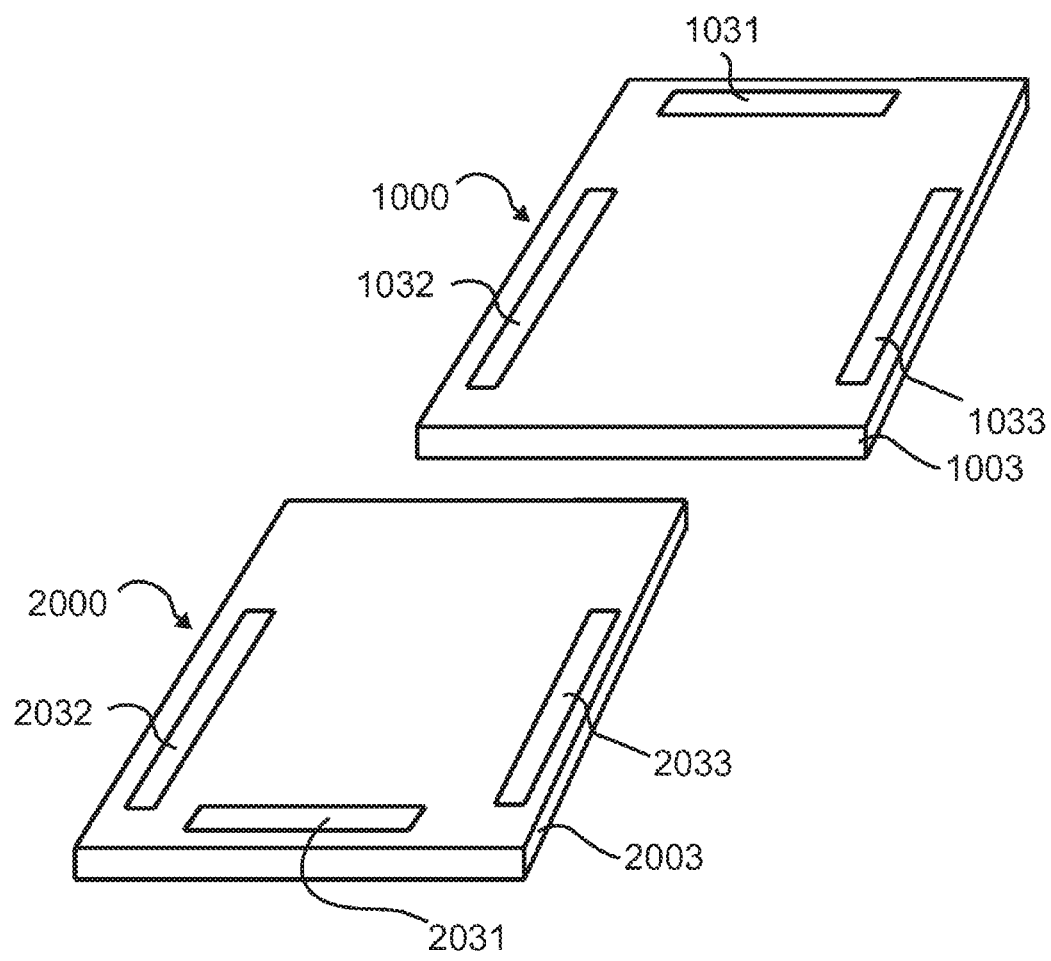
FIGS. 12 and 13 illustrate an embodiment of a device for electrical energy conversion by perspective views, in FIG. 12 only parts of electronic components of the device are represented.
Figure 13:
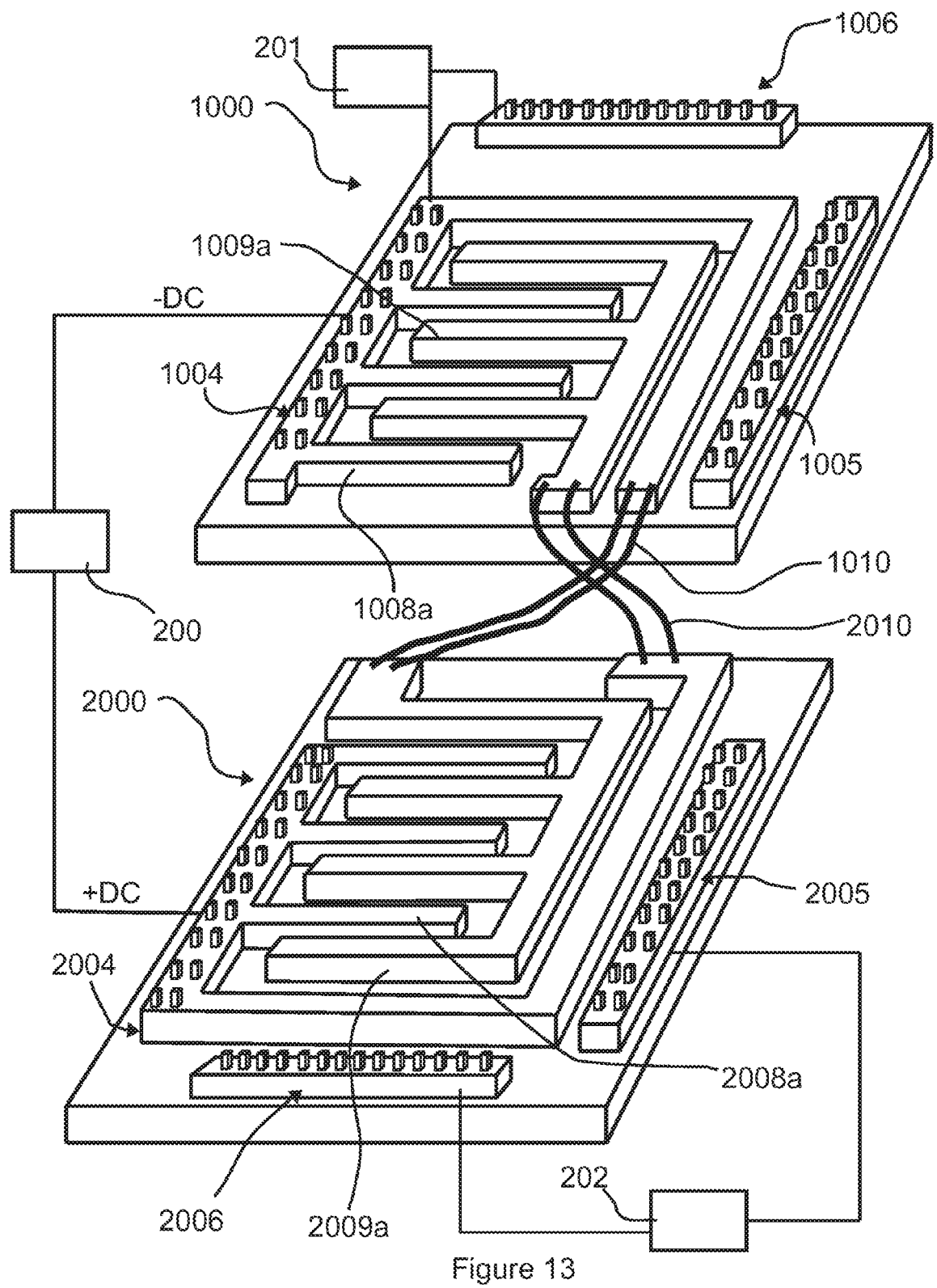

To form the electrical energy converter, it is also possible to use transistors incorporated in distinct electronic components each having an electrode connected to a different direct potential, and each chip or electronic component incorporating a capacitive half-component, the capacitive half-components of two electronic components then being connected to form the capacitive component. Thus, according to an alternative to the electronic component incorporating two transistors, the aim will be to form a device for the electrical energy conversion (or inverter), hereinafter called device, by using two electronic components as described previously and each provided with a transistor. As illustrated in FIGS. 12 and 13, the invention also relates to such a device comprising a first electronic component 1000 as described previously (and therefore provided with a corresponding transistor) and a second electronic component 2000 as described previously (and therefore provided with a corresponding transistor). In the art, the first electronic component can be likened to a so-called "low-side" component and the second electronic component can be likened to a so-called "high-side" component. The first electrode 1032 of the transistor of the first electronic component 1000 (notably situated under the first electrical connection terminal 1004 of the first electronic component 1000) is a source electrode of the transistor of the first electronic component 1000, and is intended to be electrically linked to a direct current negative potential (−DC) of an electrical power supply 200 of the device. The second electrode 1033 (notably situated under the second electrical connection terminal 1005 of the first electronic component 1000) of the transistor 1003 of the first electronic component 1000 is a drain electrode of the transistor of the first electronic component 1000, and is intended to be electrically linked to an alternating current output of the device (notably via the second electrical connection terminal 1005 of the first electronic component 1000). The control electrode 1031 of the transistor 1003 of the first electronic component 1000 is a gate electrode of the transistor 1003 of the first component 1000, the control electrode 1031 being electrically linked to the third connection terminal 1006 of the first electronic component 1000. The first electrode 2032 of the transistor 2003 of the second electronic component 2000 is a drain electrode of the transistor 2003 of the second electronic component 2000, and is intended to be electrically linked to a direct current positive potential (+DC) of the electrical power supply 200 of the device, notably via the first electrical connection terminal 2004 of the second electronic component 2000, so it will then be understood that the first terminal 2004 of the second electronic component 2000 is in electrical contact with the first electrode 2032 of the transistor of the second electronic component. The second electrode 2033 of the transistor 2003 of the second electronic component 2000 is a source electrode of the transistor 2003 of the second electronic component 2000, and is intended to be electrically linked to the alternating current output, notably via the second electrical connection terminal 2005 of the second electronic component 2000. The control electrode 2031 of the transistor 2003 of the second electronic component 2000 is a gate electrode of the transistor of the second electronic component 2000 in contact with the third connection terminal 2006. The fingers 1008a of the first set of fingers of the first electronic component 1000 are electrically linked to the fingers 2009a of the second set of fingers of the second electronic component 2000 for example by using at least one electrically conductive wire 1010 linking the first and second electronic components. The fingers 1009a of the second set of fingers of the first electronic component 1000 are electrically linked to the fingers 2008a of the first set of fingers of the second electronic component 2000 for example by using at least one electrically conductive wire 2010 linking the first and second electronic components. Here, the capacitive component comprises the fingers of the first and second sets of fingers of the first and second electronic components. It can then be said that the device for electrical energy conversion comprises the capacitive component.

In FIG. 13, the direct current electrical power supply 200 that the device can comprise is schematically represented. This power supply 200 is linked, on one side, to the first electrical connection terminal 1004 of the first electronic component 1000 to apply thereto a direct current negative potential, and, on the other side, to the first electrical connection terminal 2004 of the second electronic component 2000 to apply thereto a direct current positive potential. The device can also comprise a control system 201, 202 per transistor connected, for each transistor, to the gate of said transistor and to the source of said transistor. Moreover, although that is not represented for reasons of clarity, a layer of passivation material as described previously can be formed for each electronic component to cover the fingers and fill the spaces between the fingers notably, the device comprises the alternating current output linked to the second terminals 1005 and 2005 of the first and second electronic components 1000, 2000.

Figure 14:
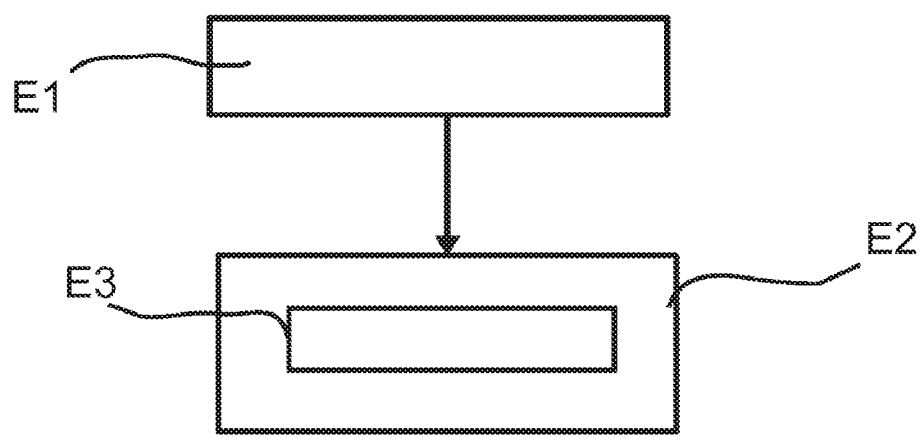
FIG. 14 illustrates steps of a method for fabricating the electronic component.

The invention also relates to a method for fabricating an electronic component, notably as described previously. In this sense, the method for fabricating the electronic component can comprise a step of supply E1 (FIG. 14) of the part 2 of the electronic component 1 comprising/incorporating the transistor 3 provided with the control electrode 31 and the first and second electrodes 32, 33 (FIG. 3). Said part 2 of the electronic component 1 comprises the connection face 7 intended to allow the formation of electrical connection terminals of the electronic component (notably of the first, second and third electrical connection terminals). Moreover, the method also comprises (FIGS. 2 and 14) a step of formation E2 of the first, second and third electrical connection terminals 4, 5, 6 of said electronic component at the level of the connection face 7 (that is to say on the connection face) such that the first electrical connection terminal 4 is electrically linked to, and notably formed so as to be in contact with, the first electrode 32 of the transistor 3, that the second electrical connection terminal 5 is electrically linked to, and notably formed so as to be in contact with, the second electrode 33 of the transistor 3, and that the third electrical connection terminal 6 is electrically linked to, and notably formed so as to be in contact with, the control electrode 31 of the transistor 3. Electrically linked is understood to mean notably the presence of an electrical link. Moreover, the method comprises a step of formation E3 of the first set 8 of electrically conductive fingers 8a and of the second set 9 of electrically conductive fingers 9a of the electronic component such that, notably at the end of the fabrication method:
    the fingers 8a, 9a of the first set 8 of fingers and of the second set 9 of fingers are interdigitated, at the level of the connection face 7, to form said at least a part of a capacitive component, and
    the fingers 8a of the first set 8 of fingers are electrically linked to the first electrical connection terminal 4.

Preferably, this step of formation E3 of the first set of fingers and of the second set of fingers is performed during the step of formation E2 of the electrical connection terminals. In other words, microelectronic technological steps will be used to simultaneously form at least a part of each of the electrical connection terminals 4, 5, 6 and at least a part of each of the fingers 8a, 9a of the first and second sets of fingers. This makes it possible to form the fingers as close as possible to the connection terminals while making it possible to use deposition or growth characteristics adapted according to a mask to have a good alignment of the fingers 8a, 9b. On the other hand, that also makes it possible to limit the number of technological steps. In other words, the step of formation E2 of the first, second and third electrical connection terminals and the step of formation E3 of the first set of fingers and of the second set of fingers are such that at least a part 4a of the first electrical connection terminal 4, and at least a part of each of the fingers of the first set of fingers, and preferably at least a part of each of the fingers of the second set of fingers and parts of the second and third electrical connection terminals, are formed simultaneously. In particular, this simultaneous formation is such that said at least a part of each finger of the first set of fingers forms a continuity of material with said at least a part of the first electrical connection terminal.

Figure 15:
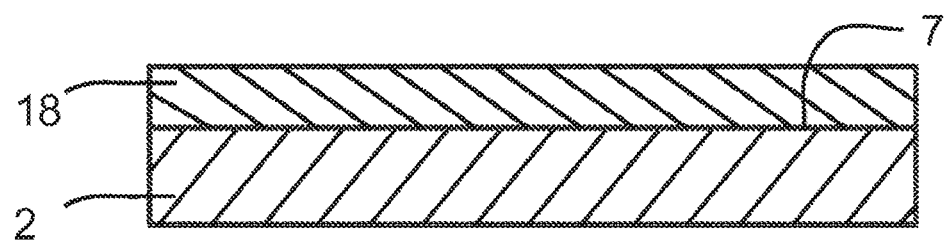
FIGS. 15 to 19 illustrate cross-sectional views making it possible to illustrate the steps of a method for fabricating the electronic component.

According to a first embodiment of the method, the formation steps E2 and E3 are such that said at least a part 4a of the first electrical connection terminal 4 and said at least a part of each of the fingers of the first set of fingers are formed simultaneously by:
    a step of formation of an electrically conductive layer 18 for example by deposition of a metallic material (FIG. 15) on the connection face 7, then
    a step of etching of said electrically conductive layer 18, notably according to a predefined etching mask 19 (FIG. 16) formed on the electrically conductive layer 18 after the formation thereof.

Figure 16:
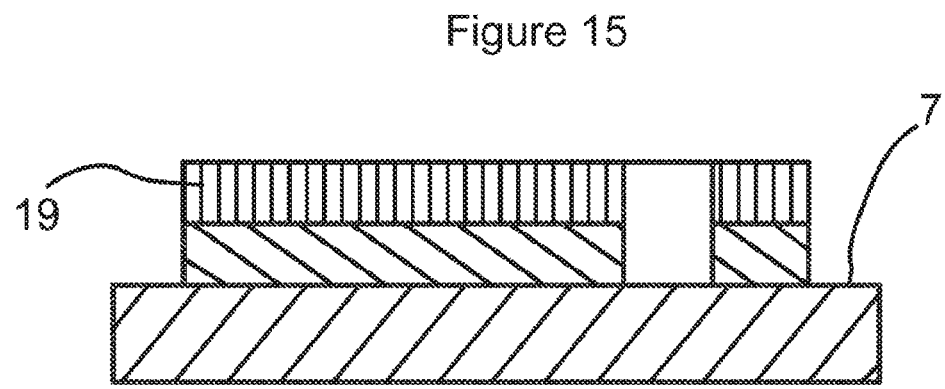

The etching is stopped notably when the connection face 7 is reached (FIG. 16). The predefined etching mask makes it possible notably for said at least a part of each of the fingers of the second set of fingers to be connected to said at least a part 4a of the first connection terminal 4 while forming a continuity of material.

Figure 17:
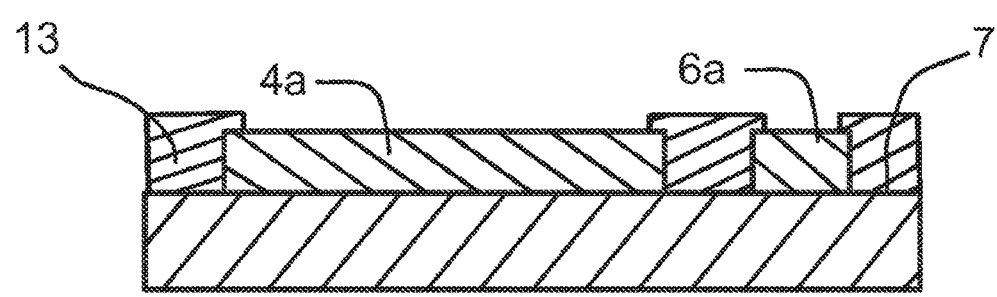
Figure 18:
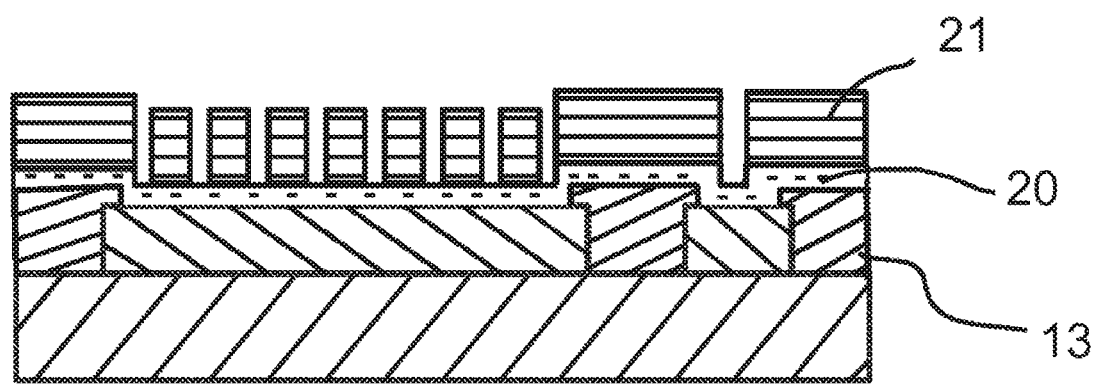
Figure 19:
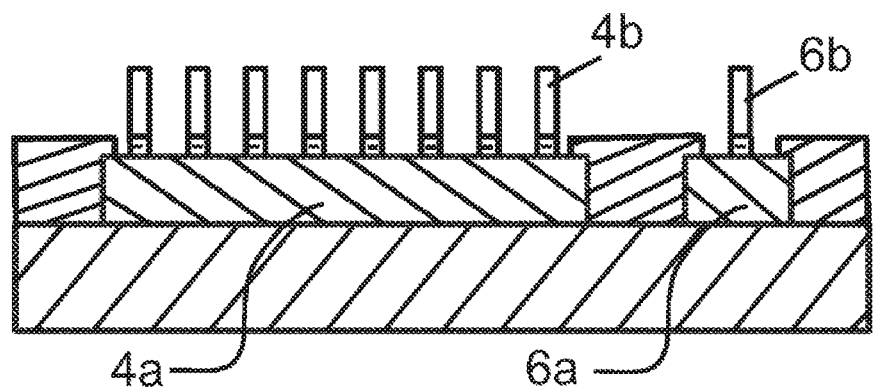

In the case where the interdigitated fingers are only formed at the level of the electrically conductive members 4a, 5a, 6a (FIGS. 2, 9, 10 and 13), the step of etching of the electrically conductive layer 18 is such that: an electrically conductive member 4a, 5a, 6a is formed for each of the first, second and third electrical connection terminals 4, 5, 6; and the fingers 8a of the first set 8 of fingers form, with the electrically conductive member of the first connection terminal, a continuity of material. In other words, the step of etching of the electrically conductive layer 18 makes it possible to simultaneously form the members 4a, 5a, 6a of the first to third connection terminals 4, the fingers 8a of the first set of fingers then connected to said member 4a of the first electrical connection terminal 4 and the fingers 9a of the second set of fingers preferably connected to the connection bus 9b for the fingers of the second set of fingers described hereinabove and notably delimited also by the step of etching of the electrically conductive layer, After that, a layer of a dielectric material (for example the passivation layer 13 of FIG. 17) can be formed to fill the spaces between the fingers, and notably so as to cover them and the members of the connection terminals, the material used can be the dielectric material described hereinabove to enhance the capacitance. This passivation layer 13 can also fill the spaces between the electrically conductive members for the electrical insulation of the future electronic component to be suitable. Finally, where appropriate, the pillars can be formed in particular after having suitably opened the passivation layer 13 as in FIG. 17 in which the tops of the electrically conductive members 4a, 6a are freed before depositing a growth layer 20 (FIG. 18) then forming a growth mask 21 on the growth layer 20. The growth mask 21 can be formed by lithography before growing the pillars, for example in copper, from the bottom of the growth mask 21 from the growth layer 20. Next, the growth mask 21 is removed and the parts of the growth layer 20 revealed by the removal of the growth mask can be removed (FIG. 19) with the result that a base made of material of the growth layer is interposed between each pillar 4b, 6b and its associated electrically conductive member 4a, 6a.

According to a second embodiment, the step of formation of the first, second and third electrical connection terminals comprises a step of production, for each of the first, second and third electrical connection terminals 4, 5, 6, of an electrically conductive member 4a, 5a, 6a topped by electrically conductive pillars 4b, 5b, 6b, for example in the manner of what is illustrated in FIG. 2. Moreover, at least a part of each of the fingers of the first and of the second sets of fingers and the pillars are formed simultaneously by growth, preferably of copper, according to a growth mask 21 (FIG. 18) whose pattern makes it possible to make pillars 4b forming said at least a part of the first electrical connection terminal 4, notably in copper, and to electrically link each finger 8a of the first set 8 of fingers to at least one pillar 4b of the first electrical connection terminal 4, notably by forming, for each finger 8a, a continuity of material comprising said finger 8a and a corresponding pillar 4b of the first electrical connection terminal 4. The growth, notably of copper, is therefore performed from the growth mask.

According to a variant of this second embodiment (FIG. 7), the steps of formation of the first to third connection terminals and of the first and second sets of fingers can be implemented by:
  a step of simultaneous formation of the electrically conductive members of the first to third electrical connection terminals and of a first longitudinal part 81, 91 of each of the fingers of the first and second sets of fingers comprising:
    a step of formation of an electrically conductive layer on the connection face, then
    a step of etching of said electrically conductive layer,
  a step of simultaneous growth of the pillars and of a second longitudinal part 82, 92 of each of the fingers of the first and second sets of fingers according to the growth mask. For each finger, the first longitudinal part 81, 91 of the finger is interposed between the connection face 7 and the second longitudinal part 82, 92 of said finger.

According to the variant in which only parts of each of the fingers are formed during the formation and the etching of the electrically conductive layer, the fingers will be completed during the formation of the pillars. For that, a passivation layer 13 is deposited after etching of the electrically conductive layer (FIG. 17) and is opened to render the tops of the electrically conductive members and parts of each of the fingers of the first and second sets of fingers formed simultaneously with the members 4a, 5a, 6a accessible. Here, the tops correspond to faces distal from the connection face 7. Next, as described hereinabove, the growth layer 20 then the mask 21 are formed in order to allow the growth of the pillars and the growth of the second part of each of the fingers of the first set and of the second set of fingers above a first corresponding part of finger.

The formation of the interdigitated fingers simultaneously with the formation of the electrically conductive members of the first, second and third electrical connection terminals is simpler to implement because the dimensions of the patterns obtained are close to the patterns conventionally used in microelectronics, so it is therefore then easy to deposit a dielectric material to passivate the electrical connection terminals and fill the spaces between the fingers. Moreover, the formation of the interdigitated fingers simultaneously with the members does not subsequently prevent the growth of pillars made of copper at the top of the bases to then provide an interconnection of "flip-chip" type.

The formation of the fingers 8a, 9a simultaneously with the formation of the pillars makes it possible to increase the facing surfaces of the adjacent fingers to optimize the value of the capacitance of the capacitive component.

The person skilled in the art is able to implement the different technological steps that make it possible to form the electronic component as described on the basis of the method described hereinabove.

In the context of the method, the step of formation of the electrically conductive layer 18 can be performed on the part 2 (FIG. 15), notably on the connection face 7, by deposition of an alloy of AlSi (that is to say aluminum-silicon, for example composed of 99 at. % aluminum and 1 at. % silicon, with at. % representing the atomic percentage) of a thickness of between 1 µm and 5 µm (and preferably equal to 4 µm) or, alternatively, by deposition of copper with a gold finish to avoid the oxidation of the copper, or even by deposition of aluminum. The step of etching (FIG. 16) of the electrically conductive layer 18 makes it possible to delimit the electrically conductive members 4a, 6a of the electrical connection terminals and, where appropriate, the fingers (or parts of these fingers) of the first and second sets of fingers. The step of etching of the electrically conductive layer 18 can be implemented after the formation of a mask 19 by lithography on the electrically conductive layer 18, notably by using a photosensitive resin, the openings of which make it possible to delimit the portions of the electrically conductive layer 18 (FIG. 16) to be removed. After etching of the electrically conductive layer 18, the mask 19 is removed, and the electrically conductive members 4a, 5a, 6a and, where appropriate, fingers or parts of fingers 8a, 9a, are obtained in the image of FIGS. 2, 7, 8, 9 and 10. Next, a passivation layer 13 (FIG. 17), notably made of dielectric material—or passivation material—as described previously, is deposited on the electrically conductive members, the connection face and, where appropriate, the fingers or the parts of fingers. One purpose of this passivation layer 13 is to electrically insulate the electrical connection terminals from one another, and it makes it possible to enhance the value of the capacitance as has been described hereinabove by filling the spaces between the adjacent fingers. This passivation layer 13 is then opened (FIG. 17) at the level of the electrically conductive members 4a, 5a, 6a to make them accessible. If the fingers have been formed simultaneously with the electrically conductive members, the method can be stopped after the opening of the passivation layer 13. To form the pillars 4b, 6b (FIGS. 18 and 19), after the opening of the passivation layer 13, a growth layer 20 is deposited so as to cover the passivation layer 13 and the tops of the members of the connection terminals made accessible. The growth layer can comprise titanium and copper, the titanium is first of all deposited preferably to a thickness of 100 nm, followed by the copper, preferably to a thickness of 200 nm, the growth layer is then formed by two successive layers respectively of titanium and of copper. Next, a growth mask 21 for the formation of the pillars is formed on the growth layer 20 (FIG. 18) so as to delimit a plurality of openings above each of the tops of the electrically conductive members. The growth mask can be a suitable photosensitive resin. Where appropriate, the growth mask 21 also has openings making it possible to form the corresponding fingers (or parts of fingers). After the formation of the openings of the growth mask 21, the growth of the pillars and, where appropriate, of the fingers or of the parts of fingers, is performed for example by ECD, the abbreviation for "electrochemical deposition", from the free parts of the growth layer 20. Finally, the growth mask 21 is removed (FIG. 19), notably by selective etching thereof, then the portions of the growth layer 20 made accessible by the removal of the growth mask 21 are removed, notably by selective etching of the material(s) used to form the growth layer. As described, bumps of brazing material can also be formed at the top of each pillar. The person skilled in the art will be able to adapt the technological steps described hereinabove to produce the different embodiments of the electronic component as described.

It has been mentioned that the pillars were intended to be used to, for example, make a connection of "flip-chip" type. In this sense, the electronic component is preferentially such that the top of the pillars forms a protrusion relative to the rest of the electronic component to facilitate the connection thereof. In this sense, when the fingers of the first set of fingers comprise a first part in continuity with the member 4 and a second part in continuity with corresponding pillars, it is possible to etch a part of the fingers to limit their height relative to the connection face so as to conserve the desired protrusion at the level of the top of the pillars formed above the member 4a to make it possible to connect external components to the electronic component via the tops of the pillars. This is also valid for the embodiment of FIG. 8.

It will be understood from what has been described above that the present invention makes it possible to form at least a part of a capacitive component, or capacitor, at the surface of the electronic component which is notably a power electronic component of GaN type. As has also been seen previously, the interdigitated fingers are formed by using technological steps present during the formation of the electronic component without capacitive component. In this sense, it is possible to form said at least a part of the capacitive component as close as possible to the connection terminals and by using technological steps compatible with the formation of the electronic components. The result thereof is that the extra cost is limited and very much lower than that linked to the formation of an additional capacitive component independent of the electronic component housing the transistor or transistors.

By proposing bringing the capacitive component closer to the transistor, the present invention makes it possible to reduce the switching losses resulting from the reduction of the overvoltages during switching and from the acceleration of the switching. Moreover, that also makes it possible to reduce the overall volume of the filtering components using the electronic component as described.

Regarding the method, the deposition and etching techniques are well known to the person skilled in the art for the materials cited.

Everything that has been said in relation to the electronic component can be applied to the method for fabricating this electronic component, and vice versa.

In particular, in the context of the fabrication method, the step of formation of the first, second and third electrical connection terminals 4, 5, 6 can comprise a step of production, at least for the first electrical connection terminal 4 and notably for each of the first, second and third electrical connection terminals, of an electrically conductive member topped by electrically conductive pillars.

It will be understood from everything which has been stated above that a continuity of material in the sense of the present description can comprise, or be formed by, copper, or the alloy of AlSi as described, or by aluminum. A finger or a part of finger in the context of the present description can comprise, or be formed by, where appropriate, copper, an alloy of AlSi, or aluminum.

The invention claimed is:

1. An electronic component comprising a part incorporating a transistor provided with a control electrode and with first and second electrodes, the electronic component comprising first, second and third electrical connection terminals extending on a connection face of said part incorporating the transistor, the first electrical connection terminal being electrically linked with the first electrode, the second electrical connection terminal being electrically linked with the second electrode and the third electrical connection terminal being electrically linked with the control electrode, the electronic component comprising a first set of electrically conductive fingers and a second set of electrically conductive fingers, the fingers of the first and second sets of fingers being interdigitated, at the level of the connection face, to form at least a part of a capacitive component, and the fingers of the first set of fingers being electrically linked to the first electrical connection terminal, wherein the first electrical connection terminal comprises:
   an electrically conductive member extending on the connection face, and
   a plurality of pillars linked electrically to the member arranged between the pillars and the connection face.

2. The component according to claim 1, wherein the fingers of the first set of fingers and of the second set of fingers extend along their length parallel to the connection face.

3. The component according to claim 1, wherein at least a part of each finger of the first set of fingers forms a continuity of material with at least a part of the first electrical connection terminal.

4. The component according to claim 1, wherein:
- the fingers of the first set of fingers form a continuity of material with the electrically conductive member of the first electrical connection terminal, or
- each finger of the first set of fingers comprises a first longitudinal part and a second longitudinal part, the first part being arranged between the second part and the connection face, said first parts forming, with the member, a first continuity of material, and said second parts each forming, with a corresponding pillar of the first electrical connection terminal, a second continuity of material, or
- each finger of the first set of fingers forms a continuity of material with at least one pillar of the first connection terminal.

5. The component according to claim 1, wherein the fingers of the first set of fingers form a continuity of material with the electrically conductive member of the first electrical connection terminal, and wherein the electronic component comprises a third set of electrically conductive fingers and a fourth set of electrically conductive fingers, the fingers of the third set of fingers and of the fourth set of fingers being interdigitated, each finger of the fourth set of fingers forming, with at least one pillar of the first electrical connection terminal, a continuity of material, and wherein:
- each finger of the first set of fingers comprises a longitudinal part arranged between a longitudinal part of a finger of the third set of fingers and the connection face,
- each finger of the second set of fingers comprises a longitudinal part arranged between a longitudinal part of a finger of the fourth set of fingers and the connection face,
- the fingers of the first set of fingers are electrically linked to the fingers of the fourth set of fingers,
- the fingers of the second set of fingers are electrically linked to the fingers of the third set of fingers.

6. The component according to claim 1, wherein the fingers of the first set of fingers and of the second set of fingers are interdigitated between the connection face and a plane situated at a distance from the connection face and passing through the first, second and third electrical connection terminals.

7. The component according to claim 1, wherein the first, second and third electrical connection terminals are arranged at the periphery of the connection face resulting in the presence of a volume facing the connection face within which the fingers of the first and second set of fingers are arranged.

8. The component according to claim 1, wherein said transistor is a first transistor of which the first electrode is a source electrode of the first transistor, the second electrode is a drain electrode of the first transistor, and the control electrode of the first transistor is a gate electrode of the first transistor, and wherein the electronic component comprises:
- an additional transistor forming a second transistor provided with a gate electrode, a source electrode and a drain electrode,
- a fourth electrical connection terminal extending on the connection face and electrically linked to the gate electrode of the second transistor,
- a fifth electrical connection terminal extending on the connection face and being electrically linked to the drain electrode of the second transistor, the fingers of the second set of fingers being electrically linked to the fifth electrical connection terminal, the source electrode of the second transistor being electrically linked to the second electrical connection terminal, the first electrical connection terminal being intended to be linked to a direct current negative potential of an electrical power supply, and the fifth electrical connection terminal being intended to be linked to a direct current positive potential of the electrical power supply with the result that the second electrical connection terminal forms an output capable of supplying an alternating current.

9. A device for converting electrical energy,
comprising a first electronic component and a second electronic component, each of the first electronic component and the second electronic component being the component according to claim 1, and wherein:
- the first electrode of the transistor of the first electronic component is a source electrode, and is intended to be electrically linked to a direct current negative potential of an electrical power supply of the device,
- the second electrode of the transistor of the first electronic component is a drain electrode, and is intended to be electrically linked to an alternating current output of the device,
- the control electrode of the transistor of the first electronic component is a gate electrode,
- the first electrode of the transistor of the second electronic component is a drain electrode, and is intended to be electrically linked to a direct current positive potential of the electrical power supply of the device,
- the second electrode of the transistor of the second electronic component is a source electrode, and is intended to be linked to the alternating current output,
- the control electrode of the transistor of the second electronic component is a gate electrode,
- the fingers of the first set of fingers of the first electronic component are electrically linked to the fingers of the second set of fingers of the second electronic component,
- the fingers of the second set of fingers of the first electronic component are electrically linked to the fingers of the first set of fingers of the second electronic component.

10. A method for fabricating the electronic component according to claim 1, said method comprising:
- a step of supply of the part of the electronic component comprising the transistor provided with the control electrode and first and second electrodes, said part of the electronic component comprising the connection face intended to allow the formation of electrical connection terminals of the electronic component,
- a step of formation of the first, second and third electrical connection terminals of said electronic component at the level of the connection face such that:
  - the first electrical connection terminal is electrically linked to the first electrode of the transistor,
  - the second electrical connection terminal is electrically linked to the second electrode of the transistor and,
  - the third electrical connection terminal is electrically linked to the control electrode of the transistor,
- a step of formation of the first set of electrically conductive fingers and of the second set of electrically conductive fingers such that:
  - the fingers of the first set of fingers and of the second set of fingers are interdigitated, at the level of the connection face, to form said at least a part of a capacitive component, and
  - the fingers of the first set of fingers are electrically linked to the first electrical connection terminal.

11. The method according to claim 10, wherein the step of formation of the first, second and third electrical connection terminals and the step of formation of the first set of electrically conductive fingers and of the second set of electrically conductive fingers are such that at least a part of the first electrical connection terminal, and at least a part of each of the fingers of the first set of fingers are formed simultaneously.

12. The method according to claim 11, wherein said at least a part of the first electrical connection terminal and said at least a part of each of the fingers of the first set of fingers are formed simultaneously by:
   a step of formation of an electrically conductive layer on the connection face, then
   a step of etching of said electrically conductive layer.

13. The method according to claim 12, wherein the step of etching of the electrically conductive layer is such that:
   an electrically conductive member is formed for each of the first, second and third connection terminals, and
   the fingers of the first set of fingers form, with the member of the first electrical connection terminal, a continuity of material.

14. The method according to claim 10, wherein the step of formation of the first, second and third electrical connection terminals comprises a step of production, for each of the first, second and third electrical connection terminals, of an electrically conductive member topped by electrically conductive pillars, and wherein at least a part of each of the fingers of the first and second sets of fingers and the pillars are formed simultaneously by growth according to a growth mask.

* * * * *